United States Patent
Kang et al.

(10) Patent No.: US 11,183,813 B2
(45) Date of Patent: Nov. 23, 2021

(54) SURFACE-EMITTING LASER DEVICE AND LIGHT EMITTING DEVICE INCLUDING THE SAME

(71) Applicant: SUZHOU LEKIN SEMICONDUCTOR CO., LTD., Taicang (CN)

(72) Inventors: Ho Jae Kang, Seoul (KR); Jung Hun Jang, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 16/243,779

(22) Filed: Jan. 9, 2019

(65) Prior Publication Data

US 2019/0214788 A1     Jul. 11, 2019

(30) Foreign Application Priority Data

Jan. 9, 2018   (KR) .................... 10-2018-0002976
Feb. 2, 2018   (KR) .................... 10-2018-0013486

(51) Int. Cl.
*H01S 5/00*     (2006.01)
*H01S 5/183*    (2006.01)
(Continued)

(52) U.S. Cl.
CPC .......... *H01S 5/18311* (2013.01); *H01S 5/187* (2013.01); *H01S 5/18361* (2013.01);
(Continued)

(58) Field of Classification Search
CPC .. H01S 5/18377; H01S 5/18361; H01S 5/309; H01S 5/34333; H01S 5/18311;
(Continued)

(56) References Cited

U.S. PATENT DOCUMENTS 5,359,447 A   10/1994  Hahn et al.
5,557,626 A    9/1996  Grodzinski et al.
(Continued)

FOREIGN PATENT DOCUMENTS

CN        1613170 A      5/2005
CN       101247026 A     8/2008
(Continued)

OTHER PUBLICATIONS

Office Action dated Sep. 30, 2019 in Korean Application No. 10-2019-0002642.
(Continued)

*Primary Examiner* — Minsun O Harvey
*Assistant Examiner* — Delma R Fordé
(74) *Attorney, Agent, or Firm* — Birch, Stewart, Kolasch & Birch, LLP

(57) ABSTRACT

Surface-emitting laser devices and light-emitting devices including the same are provided. A surface-emitting laser device can include: a first reflective layer and a second reflective layer; and an active region disposed between the first reflective layer and the second reflective layer, wherein the first reflective layer includes a first group first reflective layer and a second group first reflective layer, and the second reflective layer includes a first group second reflective layer and a second group second reflective layer.

20 Claims, 21 Drawing Sheets

(51) Int. Cl.
*H01S 5/34* (2006.01)
*H01S 5/30* (2006.01)
*H01S 5/343* (2006.01)
*H01S 5/187* (2006.01)
*H01S 5/02* (2006.01)
*H01S 5/028* (2006.01)

(52) U.S. Cl.
CPC .......... *H01S 5/18377* (2013.01); *H01S 5/309* (2013.01); *H01S 5/3077* (2013.01); *H01S 5/3407* (2013.01); *H01S 5/3409* (2013.01); *H01S 5/34333* (2013.01); *H01S 5/0201* (2013.01); *H01S 5/0213* (2013.01); *H01S 5/0216* (2013.01); *H01S 5/0282* (2013.01); *H01S 5/18358* (2013.01); *H01S 5/3054* (2013.01); *H01S 5/34313* (2013.01)

(58) Field of Classification Search
CPC .... H01S 5/187; H01S 5/3054; H01S 5/18358; H01S 5/0282; H01S 5/34313; H01S 5/183; H01S 5/343; H01S 5/18–18397; H01S 5/42–426; H01S 5/3409; H01S 5/06216; H01S 5/0427–0428; H01S 5/06825; H01S 5/0683
See application file for complete search history.

(56) References Cited

U.S. PATENT DOCUMENTS

| 8,031,752 | B1 | 10/2011 | Johnson et al. | |
|---|---|---|---|---|
| 2002/0150135 | A1* | 10/2002 | Naone | B82Y 20/00 372/45.011 |
| 2003/0123513 | A1 | 7/2003 | Villareal et al. | |
| 2009/0201965 | A1* | 8/2009 | Yoshikawa | H01S 5/18311 372/50.124 |
| 2009/0268774 | A1* | 10/2009 | Oki | H01S 5/18311 372/50.124 |
| 2009/0295902 | A1* | 12/2009 | Sato | B82Y 20/00 347/224 |
| 2011/0176122 | A1* | 7/2011 | Kaminishi | H01S 5/18311 355/67 |
| 2014/0341246 | A1* | 11/2014 | Watanabe | H01S 5/18358 372/45.012 |
| 2015/0078410 | A1* | 3/2015 | Padullaparthi | H01S 3/042 372/34 |
| 2016/0197455 | A1* | 7/2016 | Okubo | H01S 5/0425 438/32 |
| 2016/0276808 | A1* | 9/2016 | Hayakawa | H01S 5/3054 |
| 2017/0063031 | A1 | 3/2017 | Weichmann et al. | |
| 2017/0155230 | A1* | 6/2017 | Nakatsu | H01S 5/34333 |
| 2019/0222000 | A1* | 7/2019 | Ledentsov | H01S 5/18302 |
| 2021/0143608 | A1* | 5/2021 | Lee | H01S 5/04253 |
| 2021/0159672 | A1* | 5/2021 | Lee | H01S 5/18377 |

FOREIGN PATENT DOCUMENTS

| CN | 106030938 A | 10/2016 |
|---|---|---|
| JP | 8-181393 A | 7/1996 |
| KR | 10-2008-0076784 A | 8/2008 |

OTHER PUBLICATIONS

Office Action dated Oct. 22, 2019 issued in corresponding patent application in Taiwan.
Lear, K. L. et al., "High Single-Mode Power Conversion Efficiency Vertical-Cavity Top-Surface-Emitting Lasers," *IEEE Photonics Technology Letters*, Sep. 1993, 5(9):972-975, IEEE.
Reiner, G et al., "Optimization of Planar Be-Doped InGaAs VCSEL's with Two-Sided Output," *IEEE Photonics Technology Letters*, Jul. 1995, 7(7):730-732, IEEE.
Gulden, K. H et al., "High performance near-IR (765nm) AlAs/AlGaAs vertical cavity surface emitting lasers," *Electronics Letters*, Dec. 7, 1995, 31 (25):2176-2178.
European Search Report dated Jun. 25, 2019 in European Application No. 19151011.4.
Office Action dated May 17, 2019 in Korean Application No. 10-2018-0013486.
Office Action dated May 21, 2019 in Korean Application No. 10-2019-0002642.

* cited by examiner

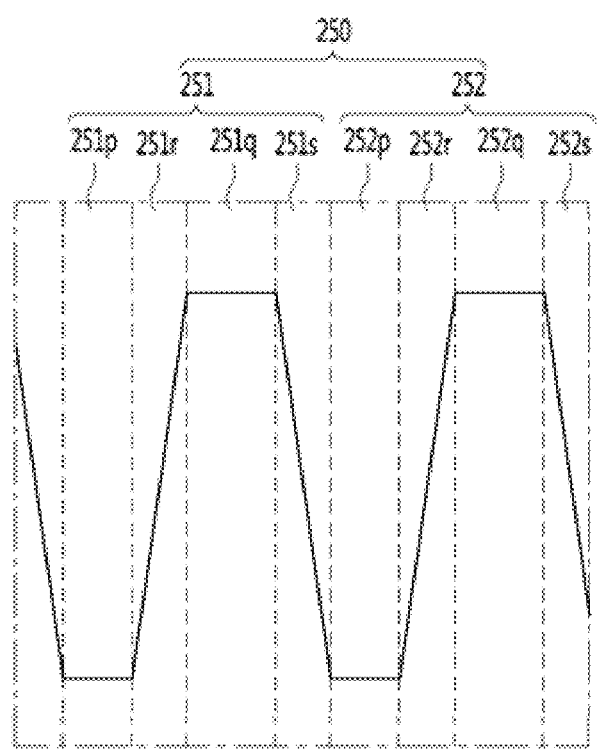
FIG. 4E(ii)

SURFACE-EMITTING LASER DEVICE AND LIGHT EMITTING DEVICE INCLUDING THE SAME

CROSS-REFERENCE TO RELATED APPLICATIONS

This application claims the benefit under 35 U.S.C. § 119 of Korean Application Nos. 10-2018-0002976, filed Jan. 9, 2018; and 10-2018-0013486, filed Feb. 2, 2018; both of which are hereby incorporated in their entireties.

BACKGROUND

1. Field of the Invention

An embodiment relates to a semiconductor device, and more particularly, to a surface-emitting laser device, a surface-emitting laser package and a light-emitting device including the same.

2. Discussion of Related Art

A semiconductor device including compounds such as GaN and AlGaN has a lot of advantages such as having wide and easily adjustable band gap energy and may be used variously as a light-emitting device, a light-receiving device, and various diodes.

In particular, a light-emitting device such as a light emitting diode or a laser diode using a compound semiconductor material of Group III-V or Group II-VI of a semiconductor may realize various colors such as red, green, blue, and ultraviolet rays by development of thin film growth technology and device materials and may realize white light rays with high efficiency by using fluorescent materials or combining colors, and has advantages of low power consumption, semi-permanent lifetime, fast response speed, safety, and environment friendliness compared to conventional light sources such as fluorescent lamps and incandescent lamps. In addition, when a light-receiving device such as a photodetector or a solar cell is manufactured using a compound semiconductor material of Group III-V or Group II-VI, by developing device materials, light of various wavelength regions from gamma rays to a radio wavelength region may be utilized by absorbing light of various wavelength regions and generating a photocurrent. In addition, the light-emitting device has advantages of fast response speed, safety, environmental friendliness and easy control of device materials, so that it can be easily used for power control or a microwave circuit or communication module.

Accordingly, applications have been expanded to a transmitting module of an optical communication means, a light-emitting diode backlight which replaces a cold cathode fluorescent lamp (CCFL) constituting a backlight of a liquid crystal display (LCD) device, white light-emitting diode lighting device which may replace the fluorescent lamp or the incandescent lamp, automotive headlights, traffic lights, and even sensors sensing gas or fire.

In addition, applications may be extended to high-frequency application circuits or other power control devices, and even communication modules.

For example, in a conventional semiconductor light source device technology, there is a vertical-cavity surface-emitting laser (VCSEL), which is used for optical communication, optical parallel processing, optical connection, etc.

Meanwhile, in the case of a laser diode used in such a communication module, it is designed to operate at a low current.

However, when such a VCSEL is applied to a laser diode autofocus (LDAF) or a structured optical sensor, it is operated at a high current of several KW, causing a problem that the output of light is decreased and a threshold current is increased.

That is, in the epi structure of the conventional VCSEL, a response speed was important in the conventional structure focusing on data optical communication, but when developing a high power package for a sensor, a light output and voltage efficiency are important characteristics, but there is a limit to simultaneously improve the light output and voltage efficiency in the conventional VCSEL structure.

For example, a VC SEL structure requires a large number of reflective layers, for example, a distributed Bragg reflector (DBR), but series resistance occurs in such a DBR.

In the related art, there has been an attempt to improve voltage efficiency by lowering the resistance by increasing doping concentration in order to inhibit the occurrence of the resistance in such a DBR. However, when the doping concentration is increased, there is a technical contradiction situation in which internal light absorption occurs due to the dopant and optical output is lowered.

In addition, the DBR as a reflective layer in the related art increases reflectance by alternately arranging AlxGaAs-based materials with different composition of Al. However, an electric field is generated by energy band bending at an interface between adjacent DBR layers, and such an electric field becomes a carrier barrier, so that a light output is lowered.

In addition, when developing a high power package for a VCSEL, a light output and voltage efficiency are important characteristics, but there is a limit to simultaneously improve the light output and voltage efficiency.

For example, the VCSEL structure of the related art has a light emitting layer and a predetermined resonator (cavity) region, and such a region has a high internal resistance, which causes a technical problem that a driving voltage increases and voltage efficiency is lowered.

In addition, in order to improve a light output in the related art, optical confinement is required around a light emitting layer, but there is no proper solution in the related art.

SUMMARY

One of technical problems solved by embodiments of the subject invention is to provide a surface-emitting laser device and a light-emitting device including the same capable of improving a light output while improving voltage efficiency.

In addition, one of technical problems solved by embodiments of the subject invention is to provide a surface-emitting laser device and a light-emitting device including the same capable of improving a light output by minimizing influence of a carrier barrier due to generation of an electric field in a reflective layer.

In addition, one of technical problems solved by embodiments of the subject invention is to provide a surface-emitting laser device and a light-emitting device including the same capable of improving a light output by improving voltage efficiency.

In addition, one of technical problems solved by embodiments of the subject invention is to provide a surface-emitting laser device and a light-emitting device including the same capable of improving a light output by improving optical confinement efficiency around a light emitting layer.

A surface-emitting laser device according to an embodiment includes: a first reflective layer 220 and a second reflective layer 250; and an active region 230 disposed between the first reflective layer 220 and the second reflective layer 250, wherein the first reflective layer 220 includes a first group first reflective layer 221 and a second group first reflective layer 222, and the second reflective layer 250 includes a first group second reflective layer 251 and a second group second reflective layer 252.

In addition, the first group second reflective layer includes a first-first layer having a first aluminum concentration, a first-second layer having a second aluminum concentration higher than the first aluminum concentration and disposed on the first-first layer and a first-fourth layer having a fourth aluminum concentration which varies from the second aluminum concentration to the first aluminum concentration and disposed on the first-second layer.

In addition, the first-second layer can be disposed between the first-first layer d the first-fourth layer.

In addition, the first-first layer can be more near the aperture region than the first-second layer.

In addition, the second reflective layer can be doped with a second conductive dopant.

In addition, the second conductive doping concentration of the first-fourth layer can be higher than that of the first-first layer and/or the first-second layer.

In addition, the second conductive dopant comprises carbon (C). And the first-first layer can be more near the aperture region than the first-second layer.

In addition, the second reflective layer can include a third group second reflective layer which is disposed more near the aperture region than the first group second reflective layer.

In addition, an average second conductive doping concentration of the third group second reflective layers can be less than that of the first group second reflective layer.

The first group second reflective layer 251 may include: a second-first reflective layer 251p having a first aluminum concentration; a second-second reflective layer 251q having a second aluminum concentration higher than the first aluminum concentration and disposed on one side of the second-first reflective layer 251p; and a second-third reflective layer 251r having a third aluminum concentration which varies from the first aluminum concentration to the second aluminum concentration and disposed between the second-first reflective layer 251p and the second-second reflective layer 251q.

A second conductive doping concentration of the second-third reflective layer 251r may be higher than a second conductive doping concentration of the second-first reflective layer 251p or the second-second reflective layer 251q.

In addition, the first group second reflective layer 251 may include: a second-first reflective layer 251p having a first refractive index; a second-second reflective layer 251q having a second refractive index lower than the first refractive index and disposed on one side of the second-first reflective layer 251p; and a second-third reflective layer 251r having a third refractive index between the first refractive index and the second refractive index and disposed between the second-first reflective layer 251p and the second-second reflective layer 251q.

The second conductive doping concentration of the second-third reflective layer 251r may be higher than the second conductive doping concentration of the second-first reflective layer 251p or the second-second reflective layer 251q.

A surface-emitting laser device according to an embodiment includes: a first reflective layer 220 and a second reflective layer 250; and an active region 230 disposed between the first reflective layer 220 and the second reflective layer 250, wherein the first reflective layer 220 includes: a first-first layer 220a having a first aluminum concentration; a first-second layer 220b having a second aluminum concentration higher than the first aluminum concentration and disposed on one side of the first-first layer 220a; and a first-third layer 220c having a third aluminum concentration which varies from the first aluminum concentration to the second aluminum concentration and disposed between the first-first layer 220a and the first-second layer 220b.

The first reflective layer 220 may include a first conductive dopant, and a first conductive dopant concentration of the first-third layer 220c may be lower than a first conductive dopant concentration of the first-first layer 220a and the first-second layer 220b.

In addition, a surface-emitting laser device according to an embodiment includes: a first reflective layer 220 and a second reflective layer 250; and an active region 230 disposed between the first reflective layer 220 and the second reflective layer 250, wherein the first reflective layer 220 includes: a first-first layer 220a having a first refractive index; a first-second layer 220b having a second refractive index lower than the first refractive index and disposed on one side of the first-first layer 220a; and a first-third layer 220c having a third refractive index between the first refractive index and the second refractive index and disposed between the first-first layer 220a and the first-second layer 220b.

The first reflective layer 220 may include a first conductive dopant, and a first conductive dopant concentration of the first-third layer 220c may be lower than a first conductive dopant concentration of the first-first layer 220a and the first-second layer 220b.

According to an embodiment, there is a technical effect that it is possible to provide a surface-emitting laser device and a light-emitting device including the same capable of improving a light output while improving voltage efficiency.

In addition, the embodiment has a technical effect that it is possible to provide a surface-emitting laser device and a light-emitting device including the same capable of improving a light output by minimizing influence of a carrier barrier due to generation of an electric field in a reflective layer.

A surface-emitting laser device according to an embodiment may include: a first reflective layer 220 including a first conductive dopant; a second reflective layer 250 including a second conductive dopant; and an active region 230 disposed between the first reflective layer 220 and the second reflective layer 250.

The active region 230 may include a first cavity 231 disposed on the first reflective layer 220 and an active layer 232 which includes a quantum well 232a and a quantum wall 232b and is disposed on the first cavity 231, and the first cavity 231 may be adjacent to the first reflective layer 220 and may include a first conductive-first doping layer 261.

A thickness of the first conductive-first doping layer 261 may be 70% or less of a thickness of the first cavity 231.

A surface-emitting laser package according to an embodiment may include the surface-emitting laser device.

According to an embodiment, it is possible to provide a surface-emitting laser device and a light-emitting device including the same having a technical effect capable of improving a light output by improving voltage efficiency.

In addition, according to the embodiment, it is possible to provide a surface-emitting laser device and a light-emitting device including the same having a technical effect capable of improving a light output by improving optical confinement efficiency around a light emitting layer.

DETAILED DESCRIPTION

Hereinafter, a light-emitting device, a light-emitting device package, and a lighting system according to embodiments will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

In the embodiments, the semiconductor device may include various electronic devices such as a light-emitting device and a light-receiving device, and the light-emitting device and the light-receiving device may include a first conductive semiconductor layer, an active layer, and a second conductive semiconductor layer. In the embodiments, the semiconductor device may be a laser diode. For example, in the embodiment, the semiconductor device may be a vertical cavity surface-emitting laser (VCSEL), but is not limited thereto.

Embodiment

Figure 1:
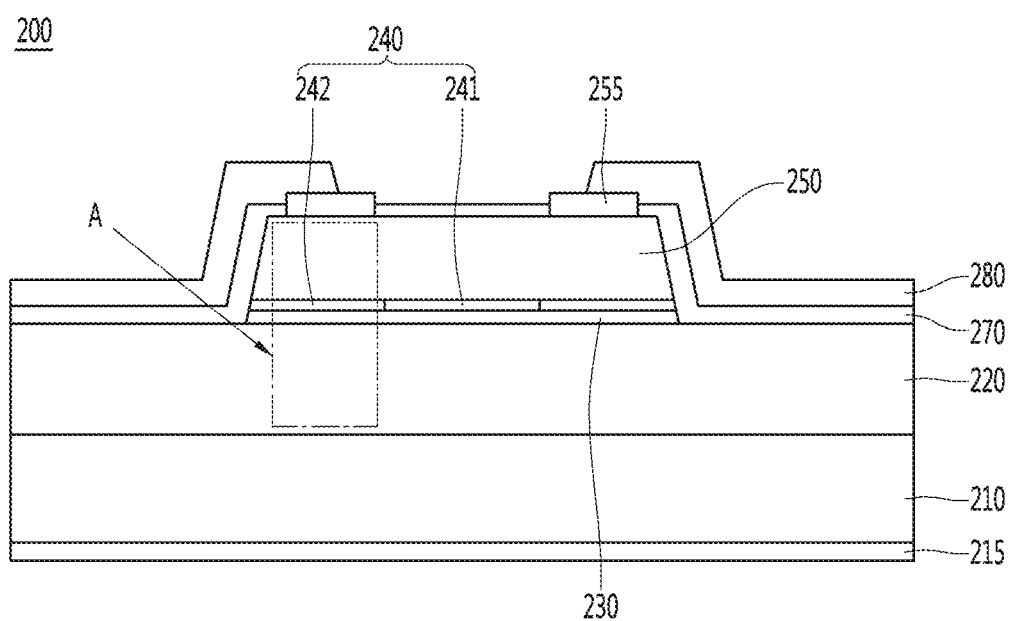
FIG. 1 is a cross-sectional view of a surface-emitting laser device according to an embodiment.

FIG. 1 is a cross-sectional view of a surface-emitting laser device 200 according to an embodiment.

Figure 2:
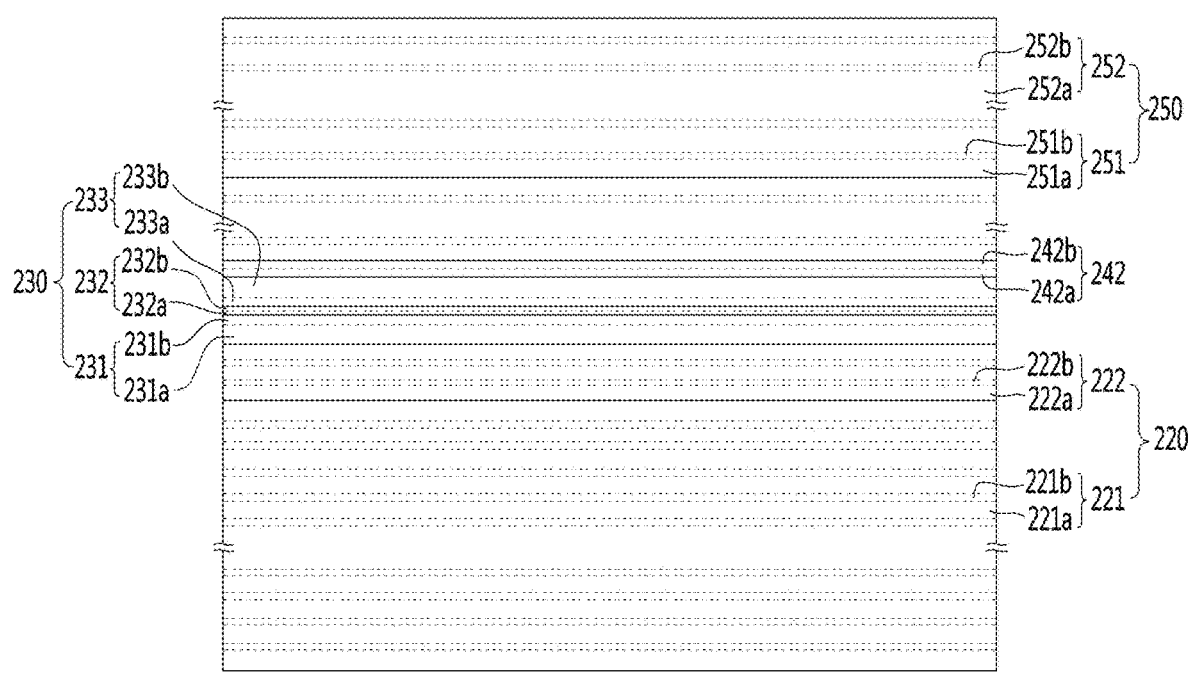
FIG. 2 is an enlarged cross-sectional view of the surface-emitting laser device according to the embodiment.

The surface-emitting laser device 200 according to an embodiment may include at least one of a first electrode 215, a first substrate 210, a first reflective layer 220, an active region 230, an aperture region 240, a second reflective layer 250, a second contact electrode 255, a second electrode 280, and a passivation layer 270. The aperture region 240 may include an insulation region 242 and an aperture 241 and may be referred to as an intermediate layer. The first reflective layer 220, the active region 230, the insulation region 242, and the second reflective layer 250 may be referred to as a light-emitting structure. As shown in FIG. 2, the active region 230 may include an active layer 232 and cavities 231 and 233, and may be referred to as a cavity region.

Hereinafter, the technical features of the surface-emitting laser device 200 according to an embodiment will be described with reference to FIG. 1 mostly, and major technical effects will also be described with reference to FIGS. 2 to 4E.

<First Substrate, First Electrode>

In an embodiment, the first substrate 210 may be a conductive substrate or a non-conductive substrate. When the conductive substrate is used, a metal having excellent electrical conductivity may be used, and since heat generated at the time of operating the surface-emitting laser device 200 should be sufficiently dissipated, a GaAs substrate or a metal substrate having high thermal conductivity, or a silicon (Si) substrate, or the like may be used.

When the non-conductive substrate is used, an AlN substrate or a sapphire ($Al_2O_3$) substrate, or a ceramic-based substrate may be used.

In an embodiment, the first electrode 215 may be disposed under the first substrate 210, and the first electrode 215 may be disposed in a single layer or a plurality of layers as a conductive material. For example, the first electrode 215 may be a metal, and may include at least one of aluminum (Al), titanium (Ti), chrome (Cr), nickel (Ni), copper (Cu), and gold (Au) and be formed as a single layer or a multi-layer structure, thereby improving an electrical characteristic and a light output.

<First Reflective Layer>

FIG. 2 is an enlarged cross-sectional view of region A of the surface-emitting laser device according to an embodiment shown in FIG. 1.

Hereinafter, the surface-emitting laser device of an embodiment will be described with reference to FIG. 2.

In an embodiment, the first reflective layer 220 may be disposed on the first substrate 210.

The first reflective layer 220 may be doped with a first conductivity type. For example, the first conductive dopant may include an n-type dopant such as Si, Ge, Sn, Se, and Te.

Also, the first reflective layer 220 may include a gallium-based compound, for example, AlGaAs, but is not limited thereto. The first reflective layer 220 may be a distributed Bragg reflector (DBR). For example, the first reflective layer 220 may have a structure in which a first layer and a second layer made of materials having different refractive indexes are alternately stacked at least once.

First, the first reflective layer 220 may include a first group first reflective layer 221 disposed on one side of the active region 230 and a second group first reflective layer 222 disposed more adjacent to the active region 230 than the first group first reflective layer 221.

The first group first reflective layer 221 and the second group first reflective layer 222 may have a plurality of layers made of a semiconductor material having a composition formula of $Al_xGa_{(1-x)}As$ (0<x<1). As Al in each layer increases, a refractive index of each layer may decrease (see FIGS. 4E and 4E(ii)), and as Ga increases, the refractive index of each layer may increase.

In addition, a thickness of each layer may be λ/4n, λ may be a wavelength of light generated in the active region 230, and n may be the refractive index of each layer with respect to light of the above-described wavelength. Here, λ may be from 650 to 980 nanometers (nm), and n may be the refractive index of each layer. The first reflective layer 220 having such a structure may have a reflectance of 99.999% with respect to light in a wavelength region of about 940 nm.

The thickness of each layer in the first reflective layer 220 may be determined according to each refractive index and a wavelength λ of light emitted in the active region 230.

For example, the first group first reflective layer 221 may include about 30 to 40 pairs of a first group first-first layer 221a and a first group first-second layer 221b. The first group first-first layer 221a may be formed thicker than the first group first-second layer 221b. For example, the first group first-first layer 221a may be formed at a thickness of about 40 to 60 nm, and the first group first-second layer 221b may be formed at a thickness of about 20 to 30 nm.

Also, the second group first reflective layer 222 may include about 5 to 15 pairs of a second group first-first layer 222a and a second group first-second layer 222b. The second group first-first layer 222a may be formed thicker than the second group first-second layer 222b. For example, the second group first-first layer 222a may be formed at a thickness of about 40 to 60 nm, and the second group first-second layer 222b may be formed at a thickness of about 20 to 30 nm.

Hereinafter, the technical effects of the surface-emitting laser device according to an embodiment will be described in detail with reference to FIGS. 3 to 4D.

First, one of the technical problems of the embodiment is to provide a surface-emitting laser device and a light-emitting device including the same capable of improving a light output by minimizing an effect of a carrier barrier due to generation of an electric field in a reflective layer.

That is, as described above, in the conventional VCSEL structure, there is a problem that a carrier barrier is generated due to generation of an electric field by energy band bending at an interface between adjacent DBR layers, thereby deteriorating a light output.

Figure 3:
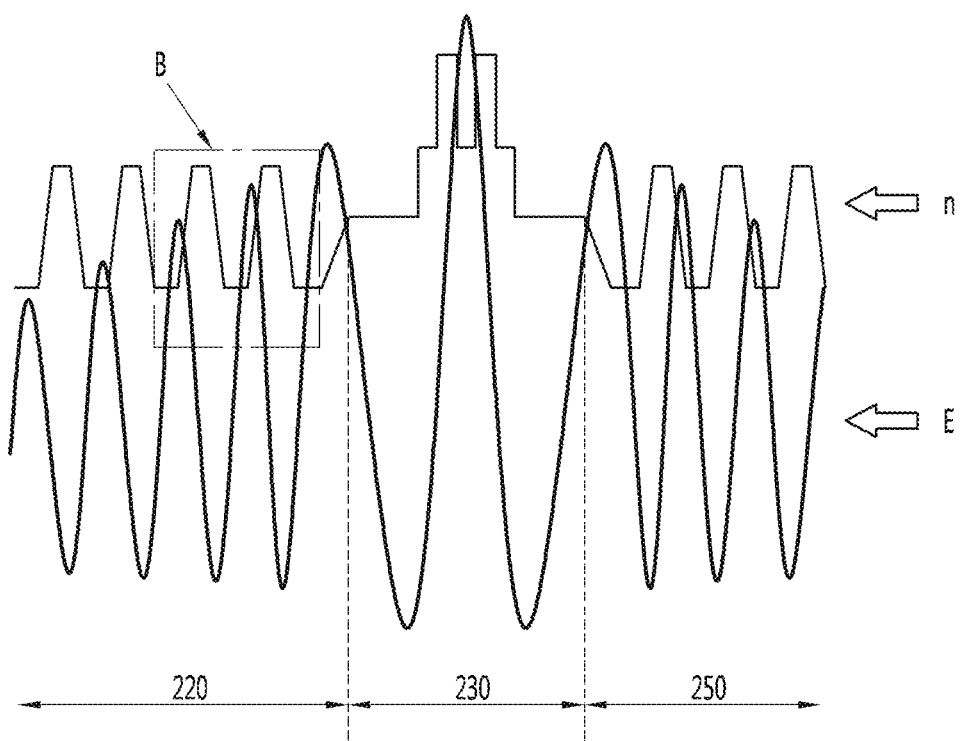
FIG. 3 is first distribution data of refractive index and light energy in the surface-emitting laser device according to the embodiment.
Figure 4A:
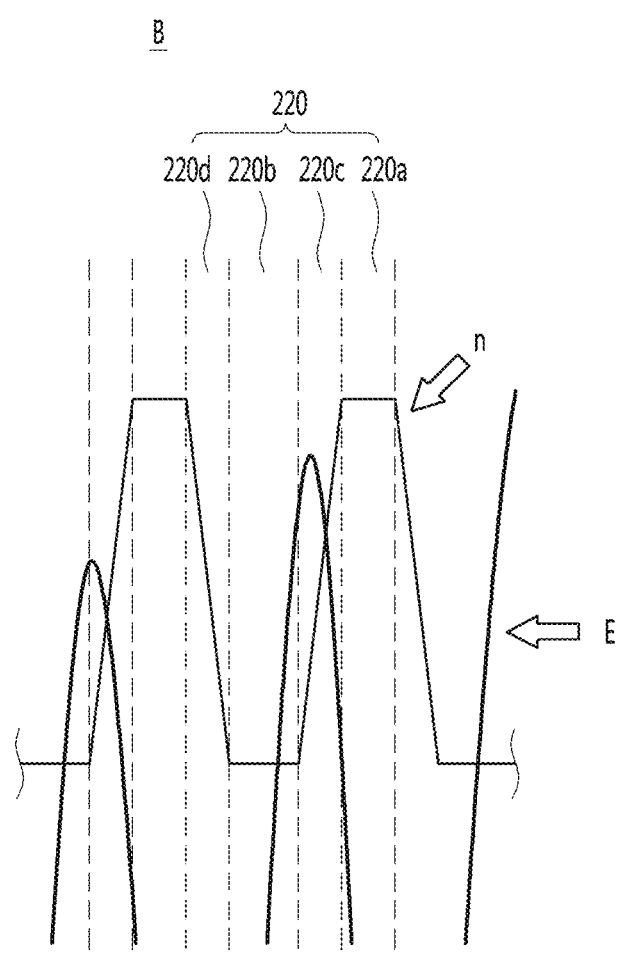
FIG. 4A is first data of refractive index and light energy in a first reflective layer of the surface-emitting laser device according to the embodiment.

FIG. 3 is first distribution data of a refractive index and light energy in the surface-emitting laser device according to an embodiment, and FIG. 4A is first data of a refractive index n and light energy E in a first reflective layer of region B of the surface-emitting laser device according to an embodiment shown in FIG. 3. According to an embodiment, distribution of the light energy emitted from the surface-emitting laser device may have a maximum value centering on the active region 230 as shown in FIG. 3, and may decrease at a predetermined period as a distance from the active region 230 becomes farther. Meanwhile, in an embodiment, a light energy distribution E is not limited to the distribution data shown in FIG. 3, and the light energy distribution in each layer may be different from that shown in FIG. 3 depending on composition, thickness, or the like of each layer.

Referring to FIG. 3, the surface-emitting laser device 200 according to an embodiment may include a first reflective layer 220, a second reflective layer 250, and an active region 230 disposed between the first reflective layer 220 and the second reflective layer 250. At this point, the surface-emitting laser device 200 according to an embodiment may have a refractive index n as shown in FIG. 3, depending on the materials of the first reflective layer 220, the second reflective layer 250, and the active region 230.

Referring to FIG. 4A, in an embodiment, the first reflective layer 220 may include a first-first layer 220a having a first refractive index, a first-second layer 220b having a second refractive index lower than the first refractive index and disposed on one side of the first-first layer 220a, and a first-third layer 220c having a third refractive index between the first refractive index and the second refractive index and disposed between the first-first layer 220a and the first-second layer 220b.

For example, the first reflective layer 220 may have a first-first layer 220a having a first aluminum concentration, a first-second layer 220b having a second aluminum concentration higher than the first aluminum concentration and disposed on one side of the first-first layer 220a, and a first-third layer 220c having a third aluminum concentration which varies from the first aluminum concentration to the second aluminum concentration and disposed between the first-first layer 220a and the first-second layer 220b.

For example, when the first reflective layer 220 includes $Al_xGa_{(1-x)}As$ (0<x<1), the first-first layer 220a may be $Al_{0.12}Ga_{0.88}As$, and when the first-second layer 220b is $Al_{0.88}Ga_{0.12}As$, the first-third layer 220c may be $Al_{x3}Ga_{(1-x3)}As$ (0.12≤X3≤0.88).

In this manner, according to an embodiment, since the first reflective layer 220 is provided with the first-third layer 220c having an aluminum concentration in an intermediate region of both between the first-first layer 220a and the first-second layer 220b adjacent to the first reflective layer 220 and the carrier barrier is reduced by minimizing generation of an electric field due to energy band bending at the interface between adjacent reflective layers, there is a technical effect that a light output may be improved.

Accordingly, according to an embodiment, it is possible to provide a surface-emitting laser device and a light-emitting device including the same, capable of improving a light output by minimizing influence of the carrier barrier due to generation of an electric field in a reflective layer.

Next, another technical problem solved by embodiments of the subject invention is to provide a surface-emitting laser device and a light-emitting device including the same, capable of improving a light output while improving voltage efficiency.

That is, in the related art, there is an attempt to improve voltage efficiency by lowering resistance by increasing doping concentration in order to inhibit the resistance from being generated in a DBR, which is a reflective layer. However, there is a technical contradiction situation such that internal light absorption occurs due to a dopant at the time of increasing the doping concentration and a light output is lowered.

In order to solve such a technical problem, an embodiment has a technical effect such that a light output may be improved and voltage efficiency may also be improved by controlling concentration of a first conductive dopant in a reflective layer in consideration of a light energy distribution mode.

Specifically, referring to FIG. 4A, the light energy E in the first-third layer 220c may be higher than those in the first-first layer 220a and the first-second layer 220b. The first-first layer 220a may be disposed more adjacent to the active region 230 than the first-second layer 220b.

Table 1 below shows the light energy distribution according to Al concentration and the refractive index of the first reflective layer in an embodiment and doping concentration data of an n-type dopant in each layer.

TABLE 1

| Layer | Al concentration (x) | Refractive index (n) | Light energy (E) | Doping concentration |
|---|---|---|---|---|
| First-first layer 220a | 0.12 | High | Middle | Middle |
| First-third layer 220c | 0.12->0.88 | Middle | High | Low |
| First-second layer 220b | 0.88 | Low | Middle | Middle |
| First-fourth layer 220d | 0.88->0.12 | Middle | Low | High |

At this point, when the first reflective layer 220 includes the first conductive dopant, concentration of the first conductive dopant of the first-third layer 220c may be lower than that of the first-first layer 220a and the first-second layer 220b.

According to an embodiment, since the light absorption by the dopant can be minimized and a light output may be improved by doping the first conductive dopant relatively low in the first-third layer 220c region, in which the light energy is relatively high, there is a specific technical effect that it is possible to provide a surface-emitting laser device and a light-emitting device including the same capable of simultaneously improving a light output and voltage efficiency.

Also, the first reflective layer 220 of an embodiment may further include a first-fourth layer 220d disposed on one side of the first-second layer 220b and having an aluminum concentration of a fourth concentration. The first-fourth layer 220d may be further disposed to be spaced apart from the active region 230 than the first-second layer 220b.

At this point, light energy in the first-fourth layer 220d may be lower than those in the first-first layer 220a and the first-second layer 220b. In this manner, the light energy in the first-fourth layer 220d may be lower than those in the first-first layer 220a, the first-second layer 220b, and the first-third layer 220c.

The concentration of the first conductive dopant in the first-fourth layer 220d may be controlled to be higher than that of the first conductive dopant in the first-first layer 220a and the first-second layer 220b.

For example, when the first reflective layer 220 includes $Al_xGa_{(1-x)}As$ (0<x<1), the first-first layer 220a may be $Al_{0.12}Ga_{0.88}As$, and when the first-second layer 220b is $Al_{0.88}Ga_{0.12}As$, the first-fourth layer 220d may be $Al_{x4}Ga_{(1-x4)}As$ (0.12≤X4≤0.88, X4 increases from 0.12 to 0.88).

At this point, the light energy in the first-fourth layer 220d may be lower than those in the first-first layer 220a and the first-second layer 220b respectively.

In an embodiment, the concentration of the first conductive dopant in the first-fourth layer 220d is controlled to be higher than that of the first conductive dopant in the first-first layer 220a and the first-third layer 220c and the dopant concentration in the first-fourth layer 220d is controlled to be maximum, and thus there is a specific technical effect that voltage efficiency may be improved by resistance improvement, at the same time, light absorption may be minimized by the dopant, and a light output may be improved.

Figure 4B:
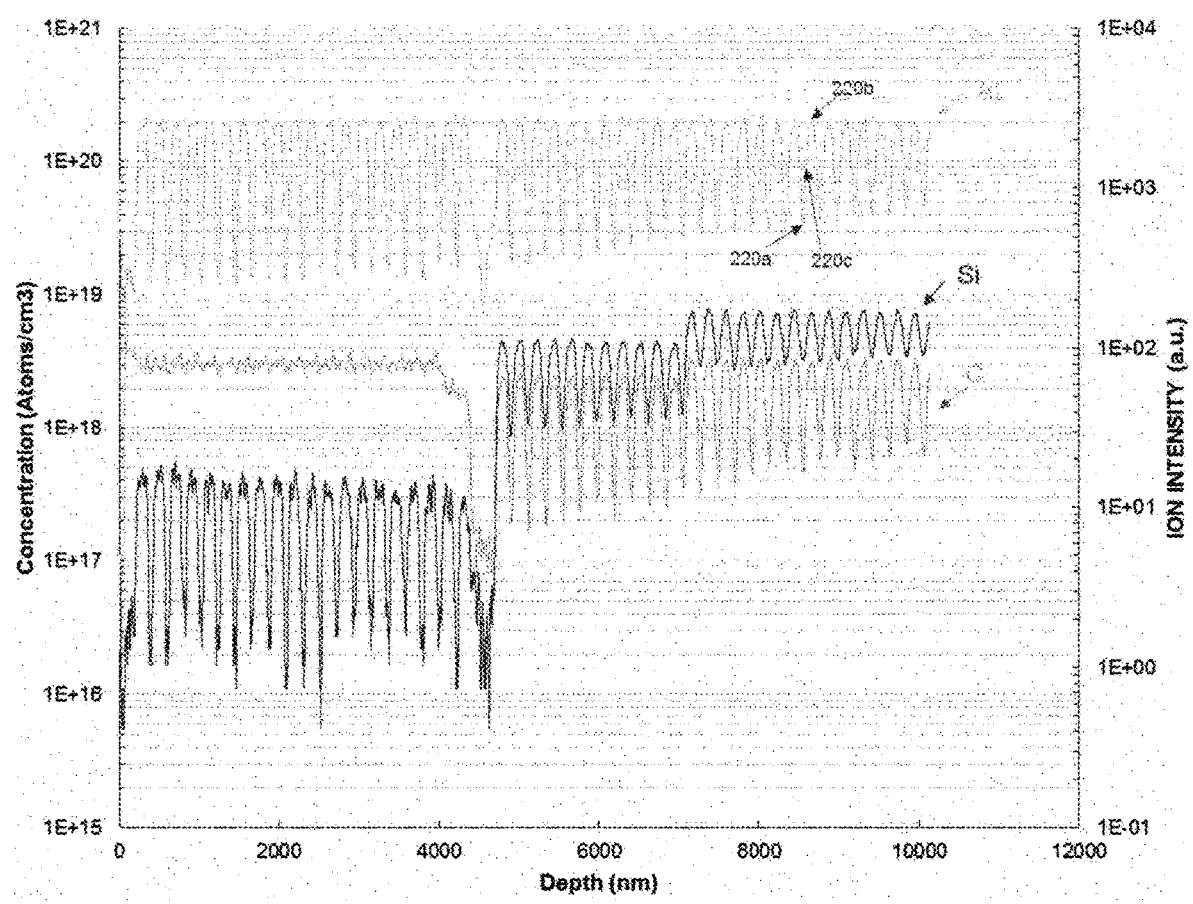
FIG. 4B is data of concentration of Al and doping concentration of dopants Si and C in the surface-emitting laser device according to the embodiment.

FIG. 4B is a graph illustrating data of a concentration of Al and doping concentration of dopants Si and C in a surface-emitting laser device according to an embodiment.

In FIG. 4B, the horizontal axis is a distance in a direction from the second reflective layer toward the first reflective layer, and the vertical axis is data of the concentration of Al and the doping concentration of the dopants Si and C.

According to an embodiment, the first reflective layer 220 doped with Si, which is a first dopant, may include a first-first layer 220a having a first aluminum concentration, a first-second layer 220b having a second aluminum concentration higher than the first aluminum concentration and disposed on one side of the first-first layer 220a, and a first-third layer 220c having a third aluminum concentration which varies from the first aluminum concentration to the second aluminum concentration and disposed between the first-first layer 220a and the first-second layer 220b.

At this point, the concentration of Al in the first-first layer 220a or the first-second layer 220b may not have a fixed value, but may have a concentration value of Al within a predetermined range.

Also, an upper limit value or a lower limit value of the dopant concentration of Si, which is the first conductive dopant, or the dopant concentration of C, which is the second conductive dopant, may not also have a specific fixed value, and the upper limit or lower limit may have a range of values in a certain range.

Figure 4C:
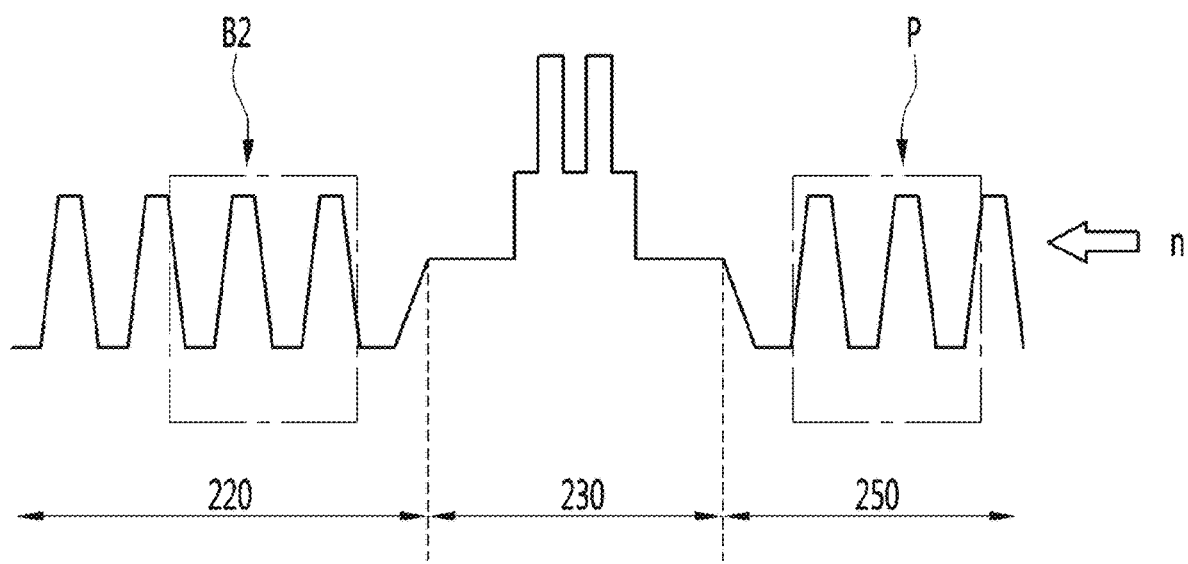
FIG. 4C is second distribution data of the refractive index in the surface-emitting laser device according to the embodiment.

Next, FIG. 4C is second distribution data of the refractive index n in a surface-emitting laser device according to an embodiment.

Figure 4D:
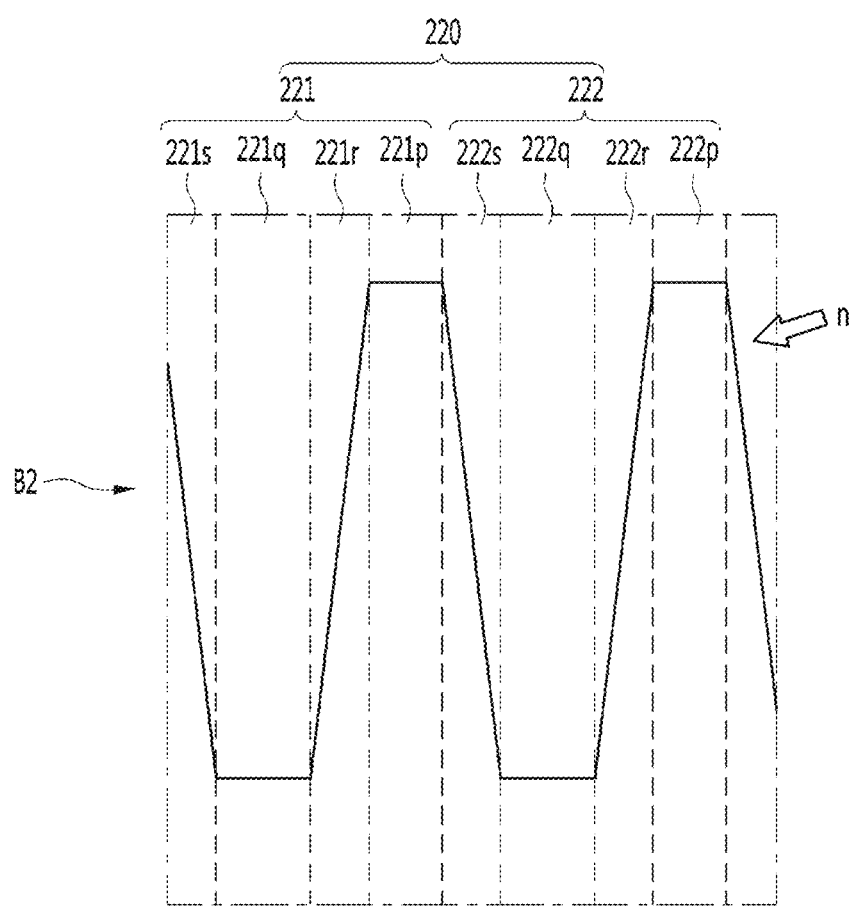
FIG. 4D is second data on the refractive index in the first reflective layer of the surface-emitting laser device according to the embodiment.
Figure 4E:
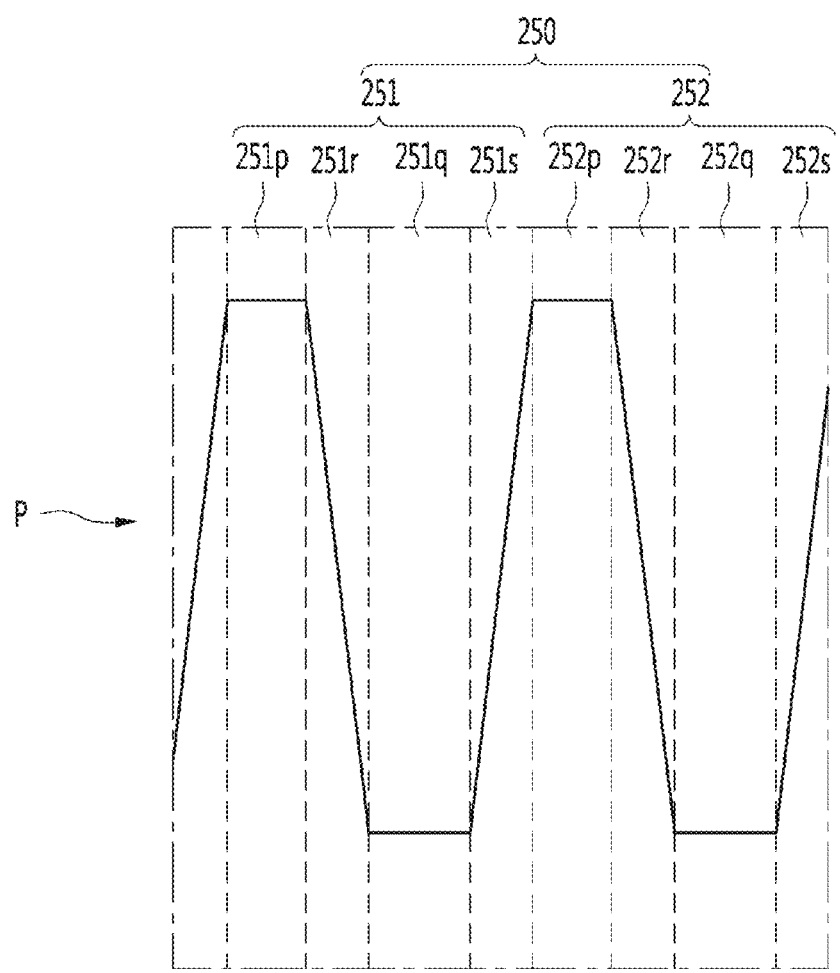
FIG. 4E is data on refractive index in a second reflective layer of the surface-emitting laser device according to the embodiment, and FIG. 4E(ii) shows the aluminum concentration of in the second reflective layer of the surface-emitting laser device according to the embodiment.

FIG. 4D is second data of the refractive index n of the first reflective layer 220 of a surface-emitting laser device according to an embodiment shown in FIG. 4C with respect to a second region B2, and FIG. 4E is third data of the refractive index n of the second reflective layer 250 with respect to a third region P. FIG. 4E(ii) shows the aluminum concentration of in the second reflective layer of the surface-emitting laser device according to the embodiment.

First, referring to FIG. 4D, in an embodiment, the first reflective layer 220 may include a first group first reflective layer 221 and a second group first reflective layer 222.

At this point, the first group first reflective layer 221 may include a plurality of layers, for example, a first-first reflective layer 221p, a first-second reflective layer 221q, a first-third reflective layer 221r, and a first-fourth reflective layer 221s.

In an embodiment, the first group first reflective layer 221 may include a plurality of pairs when the first-first reflective layer 221p to the first-fourth reflective layer 221s are formed into one pair. For example, in an embodiment, the first group first reflective layer 221 may include about 30 to 40 pairs of the first-first reflective layer 221p to the first-fourth reflective layer 221s.

Also, the second group first reflective layer 222 may include a plurality of layers, for example, a first-fifth reflective layer 222p, a first-sixth reflective layer 222q, a first-seventh reflective layer 222r, and a first-eighth reflective layer 222s.

Also, the second group first reflective layer 222 may also include a plurality of pairs when the first-fifth reflective layer 222p to the first-eighth reflective layer 222s are formed into one pair. For example, in an embodiment, the second group first reflective layer 222 may include about 5 to 15 pairs when the first-fifth reflective layer 222p to the first-eighth reflective layer 222s are formed into one pair.

In the conventional VCSEL structure, there is a problem that a carrier barrier is generated due to generation of an electric field by energy band bending at an interface between adjacent DBR layers, thereby deteriorating a light output.

To this end, one of the technical problems solved by embodiments of the subject invention is to provide a surface-emitting laser device and a light-emitting device including the same, capable of improving a light output by minimizing influence of a carrier barrier due to generation of an electric field in a reflective layer.

Referring to FIG. 4D, in an embodiment, the first group first reflective layer 221 may include a first-first reflective layer 221p, a first-second reflective layer 221q, a first-third reflective layer 221r, and a first-fourth reflective layer 221s, and each layer may have a different refractive index.

For example, the first group first reflective layer 221 may include a first-first reflective layer 221p having a first refractive index, a first-second reflective layer 221q having a second refractive index lower than the first refractive index and disposed on one side of the first-first reflective layer 221p, and a first-third reflective layer 221r having a third refractive index between the first refractive index and the second refractive index and disposed between the first-first reflective layer 221p and the first-second reflective layer 221q.

For example, the first group first reflective layer 221 may include a first-first reflective layer 221p having a first aluminum concentration, a first-second reflective layer 221q having a second aluminum concentration higher than the first aluminum concentration and disposed on one side of the first-first reflective layer 221p, and a first-third reflective layer 221r having a third aluminum concentration which varies from the first aluminum concentration to the second aluminum concentration and disposed between the first-first reflective layer 221p and the first-second reflective layer 221q.

For example, when the first group first reflective layer 221 includes $Al_xGa_{(1-x)}As$ (0<x<1), the first-first reflective layer 221p may be $Al_{0.12}Ga_{0.88}As$, the first-second reflective layer 221q may be $Al_{0.88}Ga_{0.12}As$, and the first-third reflective layer 221r may be $Al_{x3}Ga_{(1-x3)}As$ (0.12≤X3≤0.88), but the present invention is not limited thereto.

Also, the first group first reflective layer 221 may further include a first-fourth reflective layer 221s disposed outside the first-second reflective layer 221q and having a fourth aluminum concentration which varies from the first aluminum concentration to the second aluminum concentration.

For example, when the first group first reflective layer 221 includes $Al_xGa_{(1-x)}As$ (0<x<1), the first-fourth reflective layer 221s may be $Al_{x4}Ga_{(1-x4)}As$ (0.12≤X4≤0.88), but is not limited thereto.

In this manner, according to an embodiment, by providing the first-third reflective layer 221r or the first-fourth reflective layer 221s having an intermediate aluminum concentration between the adjacent first-first reflective layer 221p and the first-second reflective layer 221q, generation of an electric field due to energy band bending at an interface between adjacent reflective layers may be minimized and a carrier barrier may be lowered, and thus there is a technical effect that a light output may be improved.

Accordingly, according to an embodiment, it is possible to provide a surface-emitting laser device and a light-emitting device including the same, capable of improving a light output by minimizing influence of the carrier barrier due to generation of an electric field in a reflective layer.

Also, in an embodiment, a thickness of the first-second reflective layer 221q may be greater than that of the first-first reflective layer 221p. Also, the thickness of the first-first reflective layer 221p or the first-second reflective layer 221q may be greater than that of the first-third reflective layer 221r or the first-fourth reflective layer 221s.

At this point, the first aluminum concentration of the first-first reflective layer 221p may be higher than the second aluminum concentration of the first-second reflective layer 221q. Also, the first aluminum concentration of the first-first reflective layer 221p may be higher than the third aluminum concentration of the first-third reflective layer 221r or the fourth aluminum concentration of the first-fourth reflective layer 221s.

Accordingly, since the thickness of the first-second reflective layer 221q having a relatively high aluminum concentration is thicker than that of the first-first reflective layer 221p, it is possible to improve quality of a lattice and contribute to a light output.

Also, since the thickness of the first-first reflective layer 221p having a relatively high aluminum concentration is thicker than that of the first-third reflective layer 221r or the first-fourth reflective layer 221s, it is possible to improve quality of a lattice and contribute to a light output.

For example, since the thickness of the first-second reflective layer 221q may be about 50 to 55 nm, the thickness of the first-first reflective layer 221p may be about 40 to 45 nm, and the thickness of the first-second reflective layer 221q having a relatively high aluminum concentration is thicker than that of the first-first reflective layer 221p, it is possible to improve quality of a lattice and contribute to a light output.

Also, since the thickness of the first-third reflective layer 221r may be about 22 to 27 nm, the thickness of the first-fourth reflective layer 221s may be about 22 to 27 nm, and the thickness of the first-second reflective layer 221q or the first-first reflective layer 221p having a relatively high aluminum concentration is thicker than that of the first-third reflective layer 221r or the first-fourth reflective layer 221s, it is possible to improve quality of a lattice and contribute to a light output.

Continuously, referring to FIG. 4D, in an embodiment, the second group first reflective layer 222 may include a first-fifth reflective layer 222p, a first-sixth reflective layer 222q, a first-seventh reflective layer 222r, and a first-eighth reflective layer 222s, and each layer may have a different refractive index.

For example, the second group first reflective layer 222 may include a first-fifth reflective layer 222p having a fifth refractive index, a first-sixth reflective layer 222q having a sixth refractive index lower than the fifth refractive index and disposed on one side of the first-fifth reflective layer 222p, and a first-seventh reflective layer 222r having a seventh refractive index between the fifth refractive index and the sixth refractive index and disposed between the first-fifth reflective layer 222p and the first-sixth reflective layer 222q.

For example, the second group first reflective layer 222 may include a first-fifth reflective layer 222p having a fifth aluminum concentration, a first-sixth reflective layer 222q having a sixth aluminum concentration higher than the fifth aluminum concentration and disposed on one side of the first-fifth reflective layer 222p, and a first-seventh reflective layer 222r having a seventh aluminum concentration which varies from the fifth aluminum concentration to the sixth aluminum concentration and disposed between the first-fifth reflective layer 222p and the first-sixth reflective layer 222q.

For example, when the second group first reflective layer 222 includes $Al_xGa_{(1-x)}As$ (0<x<1), the first-fifth reflective layer 222p may be $Al_{0.12}Ga_{0.88}A$, the first-sixth reflective layer 222q may be $Al_{0.88}Ga_{0.12}As$, and the first-seventh reflective layer 222r may be $Al_{x3}Ga_{(1-x3)}As$ (0.12≤X3≤0.88), but is not limited thereto.

Also, the second group first reflective layer 222 may further include a first-eighth reflective layer 222s disposed outside the first-sixth reflective layer 222q and having a eighth aluminum concentration which varies from the fifth aluminum concentration to the sixth aluminum concentration.

For example, when the second group first reflective layer 222 includes $Al_xGa_{(1-x)}As$ (0<x<1), the first-eighth reflective layer 222s may be $Al_{x4}Ga_{(1-x4)}As$ (0.12≤X4≤0.88), but is not limited thereto.

In this manner, according to an embodiment, by providing the first-seventh reflective layer 222r or the first-eighth reflective layer 222s having an intermediate aluminum concentration between the adjacent first-fifth reflective layer 222p and the first-sixth reflective layer 222q, generation of an electric field due to energy band bending may be minimized at an interface between adjacent reflective layers may be minimized, a carrier barrier may be lowered, and thus there is a technical effect that a light output can be improved.

Accordingly, according to an embodiment, it is possible to provide a surface-emitting laser device and a light-emitting device including the same, capable of improving a light output by minimizing influence of the carrier barrier due to generation of an electric field in a reflective layer.

Also, in an embodiment, a thickness of the first-sixth reflective layer 222q may be larger than that of the first-fifth reflective layer 222p. Also, the thickness of the first-fifth reflective layer 222p or the first-sixth reflective layer 222q may be greater than that of the first-seventh reflective layer 222r or the first-eighth reflective layer 222s.

At this point, the sixth aluminum concentration of the first-sixth reflective layer 222q may be higher than the fifth aluminum concentration of the first-fifth reflective layer 222p. Also, the fifth aluminum concentration of the first-fifth reflective layer 222p may be higher than the seventh aluminum concentration of the first-seventh reflective layer 222r or the eighth aluminum concentration of the first-eighth reflective layer 222s.

Accordingly, since the thickness of the first-sixth reflective layer 222q having a relatively high aluminum concentration is thicker than that of the first-fifth reflective layer 222p, it is possible to improve quality of a lattice and contribute to a light output.

Also, since the thickness of the first-fifth reflective layer 222p having a relatively high aluminum concentration is thicker than that of the first-seventh reflective layer 222r or the first-eighth reflective layer 222s, it is possible to improve quality of a lattice and contribute to a light output.

For example, since the thickness of the first-sixth reflective layer 222q may be about 50 to 55 nm, the thickness of the first-fifth reflective layer 222p may be about 40 to 45 nm, and the thickness of the first-sixth reflective layer 222q having a relatively high aluminum concentration is thicker than that of the first-fifth reflective layer 222p, it is possible to improve quality of a lattice and contribute to a light output.

Also, since the thickness of the first-seventh reflective layer 222r may be about 22 to 27 nm, the thickness of the first-eighth reflective layer 222s may be about 22 to 27 nm, and the thickness of the first-sixth reflective layer 222q or the first-fifth reflective layer 222p having a relatively high aluminum concentration is thicker than that of the first-seventh reflective layer 222r or the first-eighth reflective layer 222s, it is possible to improve quality of a lattice and contribute to a light output.

Next, one of the technical problems solved by embodiments of the subject invention is to provide a surface-emitting laser device and a light-emitting device including the same, capable of improving a light output by minimizing influence of a carrier barrier due to generation of an electric field in a reflective layer.

At this point, referring to FIG. 3, in the surface-emitting laser device according to an embodiment, a light energy E distribution depending on a position is shown. The light energy distribution becomes lower as it becomes relatively farther from the active region 230. In an embodiment, concentration of the first conductive dopant in the first group first reflective layer 221 may be controlled to be higher than that of a dopant in the second group first reflective layer 222 in consideration of the light energy distribution.

For example, in an embodiment, the concentration of the dopant in the first group first reflective layer 221 may be about 2.00E18, and that in the second group first reflective layer 222 may be controlled at about 1.00E18. In an embodiment, the concentration unit E18 may mean $10^{18}$ (atoms/$cm^3$). For example, a concentration of 1.00E18 may mean $1.00 \times 10^{18}$ (atoms/$cm^3$), and a concentration of 1.00E17 may mean $1.00 \times 10^{17}$ (atoms/$cm^3$).

In an embodiment, an n-type dopant may be silicon (Si), but is not limited thereto.

In this manner, an embodiment controls concentration of the first conductive dopant in the second group first reflective layer 222, in which a light energy distribution is relatively high, to be lower than that of the dopant in the first group first reflective layer 221, the first conductive dopant is relatively highly doped in the first group first reflective layer 221 region, in which the light energy is relatively low, so that in the second group first reflective layer 222, the light absorption by the dopant is minimized and also, a light output is improved, and in the first group first reflective layer 221, voltage efficiency is improved by the resistance improvement by the relatively high dopant, and thus there is a specific technical effect that it is possible to provide a surface-emitting laser device and a light-emitting device including the same, capable of simultaneously improving a light output and voltage efficiency.

Next, FIG. 4E is third data of the refractive index n of the second reflective layer 250 of a surface-emitting laser device according to an embodiment shown in FIG. 4C with respect to a third region P.

Referring to FIG. 4E, in an embodiment, the second reflective layer 250 may include a first group second reflective layer 251 and a second group second reflective layer 252.

At this point, the first group second reflective layer 251 may include a plurality of layers, for example, a second-first reflective layer 251p, a second-second reflective layer 251q, a second-third reflective layer 251r, and a second-fourth reflective layer 251s.

In an embodiment, the first group second reflective layer 251 may include a plurality of pairs when the second-first reflective layer 251p to the second-fourth reflective layer 251s are formed into one pair. For example, in an embodiment, the first group second reflective layer 251 may include about two to five pairs of the second-first reflective layer 251p to the second-fourth reflective layer 251s.

Also, the second group second reflective layer 252 may include a plurality of layers, for example, a second-fifth reflective layer 252p, a second-sixth reflective layer 252q, a second-seventh reflective layer 252r, and a second-eighth reflective layer 252s.

Also, the second group second reflective layer 252 may include a plurality of pairs when the second-fifth reflective layer 252p to the second-eighth reflective layer 252s are formed into one pair. For example, in an embodiment, the second group second reflective layer 252 may include about 10 to 20 pairs when the second-fifth reflective layer 252p to the second-eighth reflective layer 252s are formed into one pair.

One of the technical problems solved by embodiments of the subject invention is to provide a surface-emitting laser device and a light-emitting device including the same, capable of improving a light output by minimizing influence of a carrier barrier due to generation of an electric field in a reflective layer.

Referring to FIG. 4E, in an embodiment, the first group second reflective layer 251 may include a second-first reflective layer 251p, a second-second reflective layer 251q, a second-third reflective layer 251r, second-fourth reflective layer 251s, and each layer may have a different refractive index.

For example, the first group second reflective layer 251 may include a second-first reflective layer 251p having a first refractive index, a second-second reflective layer 251q having a second refractive index lower than the first refractive index and disposed on one side of the second-first reflective layer 251p, and a second-third reflective layer 251r having a third refractive index between the first refractive index and the second refractive index and disposed between the second-first reflective layer 251p and the second-second reflective layer 251q.

For example, the first group second reflective layer 251 may include a second-first reflective layer 251p having a first aluminum concentration, a second-second reflective layer 251q having a second aluminum concentration higher than the first aluminum concentration and disposed on one side of the second-first reflective layer 251p, and a second-third reflective layer 251r having a third aluminum concentration which varies from the first aluminum concentration to the second aluminum concentration and disposed between the second-first reflective layer 251p and the second-second reflective layer 251q (see also FIG. 4E(ii)).

For example, when the first group second reflective layer 251 includes $Al_xGa_{(1-x)}As$ (0<x<1), the second-first reflective layer 251p may be $Al_{0.12}Ga_{0.88}As$, the second-second reflective layer 251q may be $Al_{0.88}Ga_{0.12}As$, and the second-third reflective layer 251r may be $Al_{x3}Ga_{(1-x3)}As$ (0.12≤X3≤0.88), but is not limited thereto.

Also, the first group second reflective layer 251 may further include a second-fourth reflective layer 251s disposed outside the second-second reflective layer 251q and having a fourth aluminum concentration which varies from the first aluminum concentration to the second aluminum concentration.

For example, when the first group second reflective layer 251 includes $Al_xGa_{(1-x)}As$ (0<x<1), the second-fourth reflective layer 251s may be $Al_{x4}Ga_{(1-x4)}As$ (0.12≤X4≤0.88), but is not limited thereto.

In this manner, according to an embodiment, by providing the second-third reflective layer 251r or the second-fourth reflective layer 251s having an intermediate aluminum concentration between the adjacent second-first reflective layer 251p and the second-second reflective layer 251q, generation of an electric field due to energy band bending may be minimized at an interface between adjacent reflective layers and a carrier barrier may be lowered, and thus there is a technical effect that a light output can be improved.

Accordingly, according to an embodiment, it is possible to provide a surface-emitting laser device and a light-emitting device including the same, capable of improving a light output by minimizing influence of the carrier barrier due to generation of an electric field in a reflective layer.

Also, in an embodiment, a thickness of the second-second reflective layer 251q may be greater than that of the second-first reflective layer 251p. Also, the thickness of the second-first reflective layer 251p or the second-second reflective layer 251q may be greater than that of the second-third reflective layer 251r or the second-fourth reflective layer 251s.

At this point, the second aluminum concentration of the second-second reflective layer 251q may be higher than the first aluminum concentration of the second-first reflective layer 251p. Also, the first aluminum concentration of the second-first reflective layer 251p may be higher than the third aluminum concentration of the second-third reflective layer 251r or the fourth aluminum concentration of the second-fourth reflective layer 251s.

Accordingly, since the thickness of the second-second reflective layer 251q having a relatively high aluminum concentration is thicker than that of the second-first reflective layer 251p, it is possible to improve quality of a lattice and contribute to a light output.

Also, since the thickness of the second-first reflective layer 251p having a relatively high aluminum concentration is thicker than that of the second-third reflective layer 251r or the second-fourth reflective layer 251s, it is possible to improve quality of a lattice and contribute to a light output.

For example, since the thickness of the second-second reflective layer 251q may be about 50 to 55 nm, the thickness of the second-first reflective layer 251p may be about 26 to 32 nm, and the thickness of the second-second reflective layer 251q having a relatively high aluminum concentration is thicker than that of the second-first reflective layer 251p, it is possible to improve quality of a lattice and contribute to a light output.

Also, since the thickness of the second-third reflective layer 251r may be about 22 to 27 nm, the thickness of the second-fourth reflective layer 251s may be about 22 to 27 nm, and the thickness of the second-second reflective layer 251q or the second-first reflective layer 251p having a relatively high aluminum concentration is thicker than that of the second-third reflective layer 251r or the second-fourth reflective layer 251s, it is possible to improve quality of a lattice and contribute to a light output.

Continuously, referring to FIG. 4E, in an embodiment, the second group second reflective layer 252 may include a second-fifth reflective layer 252p, a second-sixth reflective layer 252q, a second-seventh reflective layer 252r, and a second-eighth reflective layer 252s, and each layer may have a different refractive index.

For example, the second group second reflective layer 252 may include a second-fifth reflective layer 252p having a fifth refractive index, a second-sixth reflective layer 252q having a sixth refractive index lower than the fifth refractive index and disposed on one side of the second-fifth reflective layer 252p, and a second-seventh reflective layer 252r having a seventh refractive index between the fifth refractive index and the sixth refractive index and disposed between the second-fifth reflective layer 252p and the second-sixth reflective layer 252q.

For example, the second group second reflective layer 252 may include a second-fifth reflective layer 252p having a fifth aluminum concentration, a second-sixth reflective layer 252q having a sixth aluminum concentration higher than the fifth aluminum concentration and disposed on one side of the second-fifth reflective layer 252p, and a second-seventh reflective layer 252r having a seventh aluminum concentration which varies from the fifth aluminum concentration to the sixth aluminum concentration and disposed between the second-fifth reflective layer 252p and the second-sixth reflective layer 252q.

For example, when the second group second reflective layer 252 includes $Al_xGa_{(1-x)}As$ (0<x<1), the second-fifth reflective layer 252p may be $Al_{0.12}Ga_{0.88}As$, the second-sixth reflective layer 252q may be $Al_{0.88}Ga_{0.12}As$, and the second-seventh reflective layer 252r may be $Al_{x3}Ga_{(1-x3)}As$ (0.12≤X3≤0.88), but is not limited thereto.

Also, the second group second reflective layer 252 may further include a second-eighth reflective layer 252s disposed outside the second-sixth reflective layer 252q and having an eighth aluminum concentration which varies from the fifth aluminum concentration to the sixth aluminum concentration.

For example, when the second group second reflective layer 252 includes $Al_xGa_{(1-x)}As$ (0<x<1), the second-eighth reflective layer 252s may be $Al_{x4}Ga_{(1-x4)}As$ (0.12≤X4≤0.88), but is not limited thereto.

In this manner, according to an embodiment, by providing the second-seventh reflective layer 252r or the second-eighth reflective layer 252s having an intermediate aluminum concentration between the adjacent second-fifth reflective layer 252p and the second-sixth reflective layer 252q, generation of an electric field due to energy band bending may be minimized at an interface between adjacent reflective layers, and a carrier barrier may be lowered, and thus there is a technical effect that a light output can be improved.

Accordingly, according to an embodiment, it is possible to provide a surface-emitting laser device and a light-emitting device including the same, capable of improving a light output by minimizing influence of the carrier barrier due to generation of an electric field in a reflective layer.

Also, in an embodiment, a thickness of the second-sixth reflective layer 252q may be greater than that of the second-fifth reflective layer 252p. Also, the thickness of the second-fifth reflective layer 252p or the second-sixth reflective layer 252q may be greater than that of the second-seventh reflective layer 252r or the second-eighth reflective layer 252s.

At this point, the sixth aluminum concentration of the second-sixth reflective layer 252q may be higher than the fifth aluminum concentration of the second-fifth reflective layer 252p. Also, the fifth aluminum concentration of the second-fifth reflective layer 252p may be higher than the seventh aluminum concentration of the second-seventh reflective layer 252r or the eighth aluminum concentration of the second-eighth reflective layer 252s.

Accordingly, since the thickness of the second-sixth reflective layer 252q having a relatively high aluminum concentration is thicker than that of the second-fifth reflective layer 252p, it is possible to improve quality of a lattice and contribute to a light output.

Also, since the thickness of the second-fifth reflective layer 252p having a relatively high aluminum concentration is thicker than that of the second-seventh reflective layer 252r or the second-eighth reflective layer 252s, it is possible to improve quality of a lattice and contribute to a light output.

For example, since the thickness of the second-sixth reflective layer 252q may be about 50 to 55 nm, the thickness of the second-fifth reflective layer 252p may be about 40 to 45 nm, and the thickness of the second-sixth reflective layer 252q having a relatively high aluminum concentration is thicker than that of the second-fifth reflective layer 252p, it is possible to improve quality of a lattice and contribute to a light output.

Also, since the thickness of the second-seventh reflective layer 252r may be about 22 to 27 nm, the thickness of the second-eighth reflective layer 252s may be about 22 to 27 nm, and the thickness of the second-sixth reflective layer 252q or the second-fifth reflective layer 252p having a relatively high aluminum concentration is thicker than that of the second-seventh reflective layer 252r or the second-eighth reflective layer 252s, it is possible to improve quality of a lattice and contribute to a light output.

Next, one of the technical problems solved by embodiments of the subject invention is to provide a surface-emitting laser device and a light-emitting device including the same, capable of improving a light output by minimizing influence of a carrier barrier due to a generation of an electric field in a reflective layer.

At this point, referring to FIG. 3, in the surface-emitting laser device according to an embodiment, a light energy E distribution depending on a position is shown. The light energy distribution becomes lower as it becomes relatively farther from the active region 230. In an embodiment, concentration of the first conductive dopant in the first group second reflective layer 251 may be controlled to be higher than that of the dopant in the second group second reflective layer 252 in consideration of the light energy distribution.

For example, in an embodiment, the concentration of the dopant in the first group second reflective layer 251 may be about 7.00E17 to 1.50E18, and the concentration of the dopant in the second group second reflective layer 252 may be controlled to be about 1.00E18 to 3.00E18. In an embodiment, the concentration unit 1.00E18 may mean $1.00 \times 10^{18}$ (atoms/cm$^3$). In an embodiment, a p-type dopant may be carbon (C), but is not limited thereto.

In this manner, an embodiment controls concentration of the second conductive dopant in the second group second reflective layer 252 to be higher than that of the dopant in the first group second reflective layer 251, the second conductive dopant is relatively lowly doped in the first group second reflective layer 251 region, in which the light energy is relatively high, so that in the first group second reflective layer 251, the light absorption by the dopant is minimized and also, a light output is improved, and in the second group second reflective layer 252, voltage efficiency is improved by the resistance improvement by the relatively high dopant, and thus there is a specific technical effect that it is possible to provide a surface-emitting laser device and a light-emitting device including the same, capable of simultaneously improving a light output and voltage efficiency.

Also, according to the related art, there is a possibility that a standing wave may be absorbed by such a dopant to be proceeded at an interface with the DBR. Accordingly, in an embodiment, much doping proceeds at a node position in which an optical power reflectance of the standing wave is the smallest to minimize the resistance and at an antinode position, doping proceeds as low as possible, and thus there is a technical effect that light absorption can be minimized. The node position may mean a point in which the refractive index of each layer is changed by rising or falling.

Continuously, referring to FIG. 4E, the refractive indexes of the second-first reflective layer 251p and the second-second reflective layer 251q in the first group second reflective layer 251 may be antinode positions, which are not changed to a top point or a bottom point. Also, the refractive indexes of the second-third reflective layer 251r and the second-fourth reflective layer 251s in the first group second reflective layer 251 may be node positions changed by a rising or falling.

Accordingly, in an embodiment, the second conductive doping concentration of the second-third reflective layer 251r or the second-fourth reflective layer 251s may be controlled higher than the second conductive doping concentration of the second-first reflective layer 251p or the second-second reflective layer 251q.

For example, the second conductive doping concentration of the second-third reflective layer 251r or the second-fourth reflective layer 251s may be about 1.00E18 to 1.50E18, and that of the second-first reflective layer 251p or the second-second reflective layer 251q may be about 6.00E17 to 8.00E17.

Accordingly, in the second-third reflective layer 251r or the second-fourth reflective layer 251s, which is the node position at which optical power reflectance of the standing wave is low, much doping proceeds to minimize the resistance, and in the second-first reflective layer 251p or the second-second reflective layer 251q, which is the antinode position, low doping proceeds, and thus there is a complex technical effect capable of minimizing light absorption.

Also, in an embodiment, concentration of the second conductive dopant of the second-fourth reflective layer 251s, which is the node position in which the refractive index increases in the direction away from the active region 230, in the second-third reflective layer 251r or the second-fourth reflective layer 251s which is the node position, may be controlled to be higher than concentration of the second conductive dopant of the second-third reflective layer 251r, which is the node position in which the refractive index decreases.

In this manner, the concentration of the second conductive dopant of the second-fourth reflective layer 251s, which is the node position in which the optical reflectivity is relatively lower and the refractive index increases may be controlled to be high, to improve electrical characteristics.

For example, the second conductive doping concentration of the second-fourth reflective layer 251s may be about 1.50E18, the second conductive doping concentration of the second-third reflective layer 251r may be about 1.00E18, and the concentration of the second conductive dopant in the second-fourth reflective layer 251s, which is relatively lower in optical reflectivity may be controlled to be high to improve the electrical characteristics.

Continuously, referring to FIG. 4E, the refractive indexes of the second-fifth reflective layer 252p and the second-sixth reflective layer 252q in the second group second reflective layer 252 may be antinode positions, which are not changed to a top point or a bottom point. Also, the refractive indexes of the second-seventh reflective layer 252r and the second-eighth reflective layer 252s in the second group second reflective layer 252 may be node positions changed by a rising or falling.

In an embodiment, the second conductive doping concentration of the second-seventh reflective layer 252r or the second-eighth reflective layer 252s may be controlled higher than the second conductive doping concentration of the second-fifth reflective layer 252p or the second-sixth reflective layer 252q.

For example, the second conductive doping concentration of the second-seventh reflective layer 252r or the second-eighth reflective layer 252s may be about 2.00E18 to 3.00E18, and that of the second-fifth reflective layer 252p or the second-sixth reflective layer 252q may be about 1.00E18 to 1.50E18.

Accordingly, in the second-seventh reflective layer 252r or the second-eighth reflective layer 252s, which is the node position at which optical power reflectance of the standing wave is low, much doping proceeds to minimize the resistance, and in the second-fifth reflective layer 252p or the second-sixth reflective layer 252q, which is the antinode position, low doping proceeds, and thus there is a complex technical effect capable of minimizing light absorption.

Also, in an embodiment, concentration of the second conductive dopant of the second-eighth reflective layer 252s, which is the node position in which the refractive index increases in the direction away from the active region 230, in the second-seventh reflective layer 252r or the second-eighth reflective layer 252s, may be controlled to be higher than concentration of the second conductive dopant of the second-seventh reflective layer 252r, which is the node position in which the refractive index decreases.

In this manner, the concentration of the second conductive dopant in the second-eighth reflective layer 252s, which is the node position in which the optical reflectivity is relatively lower and the refractive index increases, may be controlled to be high to improve electrical characteristics.

For example, the second conductive doping concentration of the second-eighth reflective layer 252s may be about 3.00E18, the second conductive doping concentration of the second-seventh reflective layer 252r may be about 2.00E18, and the concentration of the second conductive dopant in the second-eighth reflective layer 252s, which is relatively lower in optical reflectivity may be controlled to be high to improve the electrical characteristics.

Figure 4F:
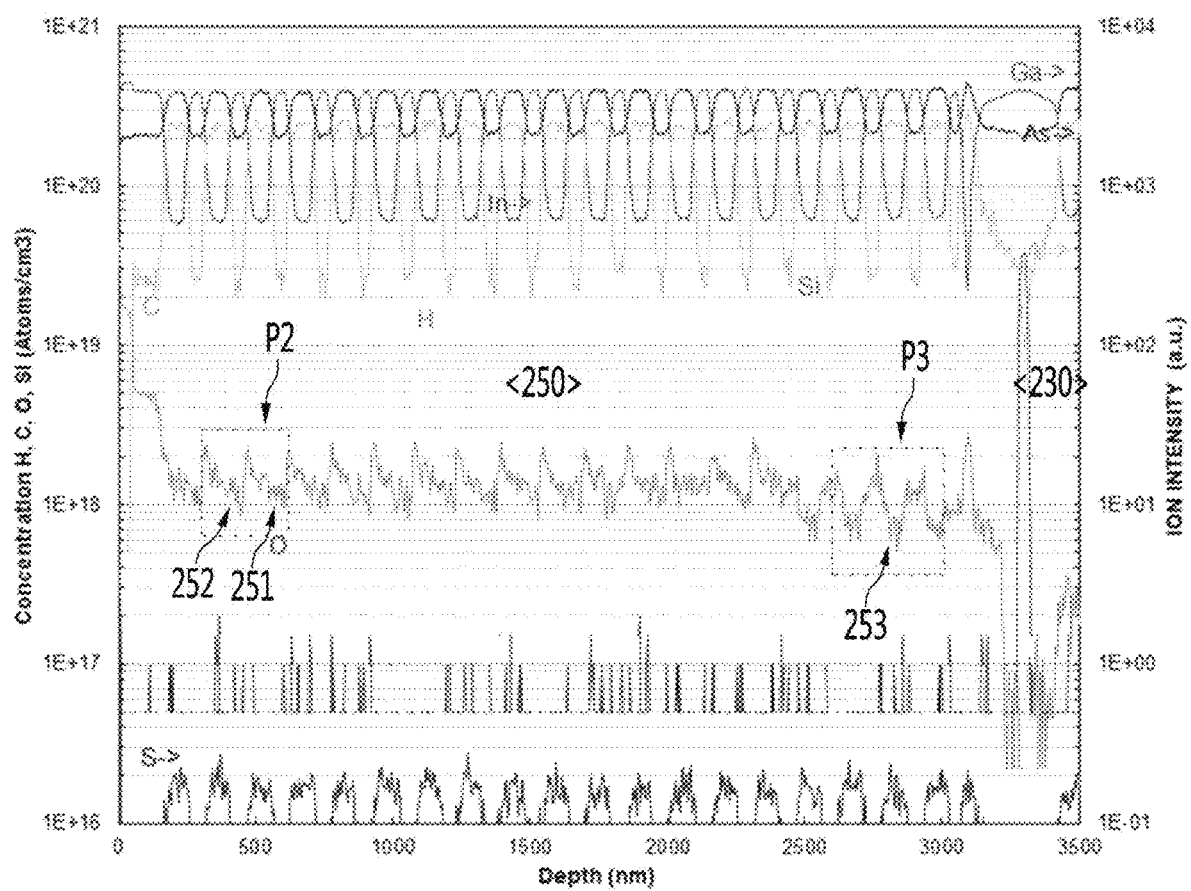
FIG. 4F is Secondary-ion mass spectrometry (SIMS) data of the second reflective layer of the surface-emitting laser device according to the embodiment.
Figure 4G:
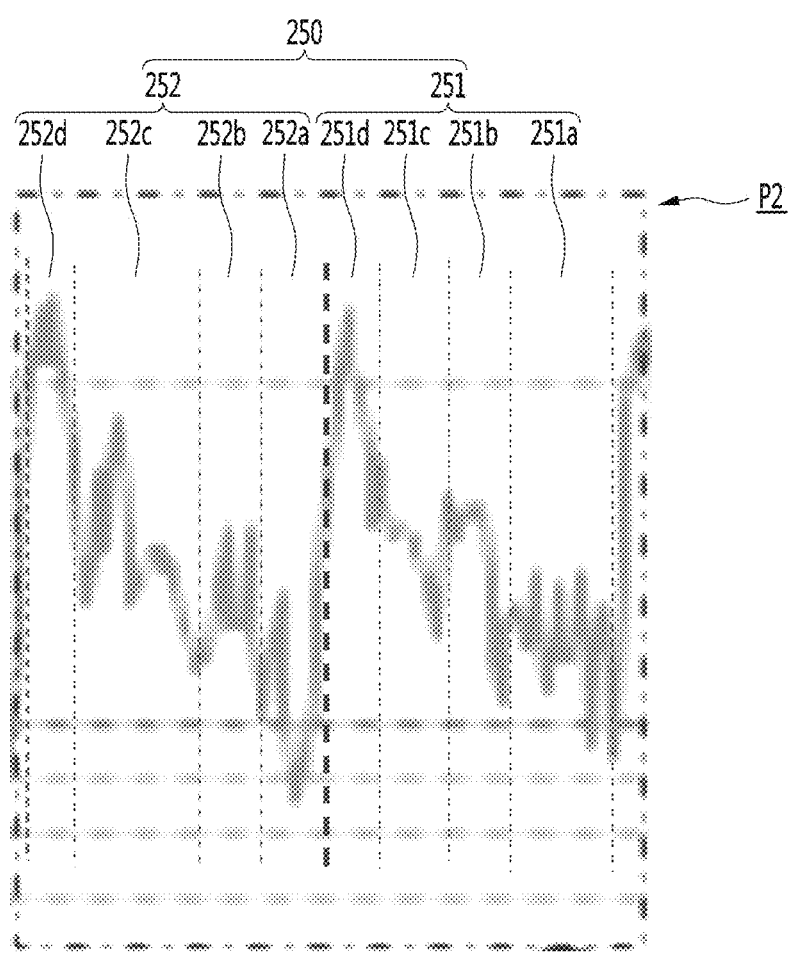
FIG. 4G is an enlarged view of P2 region of FIG. 4F.

Next, FIG. 4F is Secondary-ion mass spectrometry (SIMS) data of the second reflective layer of the surface-emitting laser device according to the embodiment and FIG. 4G is an enlarged view of P2 region of FIG. 4F.

Referring to FIG. 4G, in an embodiment, the second reflective layer 250 may include a first group second reflective layer 251 and a second group second reflective layer 252. The first group second reflective layer 251 is more near the aperture region 240 than the second group second reflective layer 252.

For example, the first group second reflective layer 251 may include a first-first layer 251a having a first aluminum concentration, a first-second layer 251b having a second aluminum concentration higher than the first aluminum concentration and disposed on the first-first layer 251a, and a first-fourth layer 251d having a fourth aluminum concentration which varies from the second aluminum concentration to the first aluminum concentration and disposed on the first-second layer 251b.

And the first-second layer 251b is disposed between the first-first layer 251a and the first-fourth layer 251d. The first-first layer 251a is more near the aperture region 240 than the first-second layer 251b.

Also, the first group second reflective layer 251 may further include a second-fourth reflective layer 251s disposed outside the second-second reflective layer 251q and having a fourth aluminum concentration which varies from the first aluminum concentration to the second aluminum concentration.

Also, the first group second reflective layer 251 may include a first-third layer 251c disposed between the first-second layer 251b and the first-fourth layer 251d.

Also, in an embodiment, the second reflective layer 250 may be doped with a second conductive dopant. In an embodiment, the p-type dopant may be carbon (C), but is not limited thereto.

Also, in an embodiment, the second conductive doping concentration of the first-fourth layer 251d may be higher than that of the first-first layer 251a and/or the first-second layer 251b.

Accordingly, in the first-fourth layer 251d, which is the node position at which optical power reflectance of the standing wave is low, much doping proceeds to minimize the resistance, and can improve electrical characteristics.

Also in the first-first layer 251a, which is the antinode position including other layer, low doping proceeds, and thus there is a complex technical effect capable of minimizing light absorption.

Also referring to FIG. 4G, in an embodiment, the second group second reflective layer 252 may include a second-first layer 252a having a first aluminum concentration, a second-second layer 252b having a second aluminum concentration higher than the first aluminum concentration and disposed on the second-first layer 252a, and a second-fourth layer 252d having a fourth aluminum concentration which varies from the second aluminum concentration to the first aluminum concentration and disposed on the second-second layer 252b.

And the second-second layer 252b is disposed between the second-first layer 252a and the second-fourth layer 252d. The second-first layer 252a is more near the aperture region 240 than the second-second layer 252b.

Also, the second group second reflective layer 252 may include a second-third layer 252c disposed between the second-second layer 252b and the second-fourth layer 252d.

Also, in an embodiment, the second conductive doping concentration of the second-fourth layer 252d may be higher than that of the second-first layer 252a and/or the second-second layer 252b.

Accordingly, in the second-fourth layer 252d, which is the node position at which optical power reflectance of the standing wave is low, much doping proceeds to minimize the resistance, and can improve electrical characteristics.

Also in the second-first layer 252a, which is the antinode position including other layer, low doping proceeds, and thus there is a complex technical effect capable of minimizing light absorption.

Again, referring to FIG. 4G, in an embodiment, the second reflective layer 250 may include a third group second reflective layer 253 which is disposed in third region P3. The third group second reflective layer 253 is more near the aperture region 240 than the first group second reflective layer 251. Two or three third group second reflective layers 253 can be disposed in the third region P3.

Also, in an embodiment, average second conductive doping concentration of the third group second reflective layers 253 may be less than that of the first group second reflective layers 251 which is disposed in the second region P2.

Also in the third group second reflective layers 253, which is near the aperture region 240, low doping proceeds, and thus there is a complex technical effect capable of minimizing light absorption.

Also, in the first group second reflective layers 251 and/or second group second reflective layers 252, which are away from the aperture region 240, at which optical power reflectance of the standing wave is low, much doping proceeds to minimize the resistance, and can improve electrical characteristics.

Table 2 below shows chip feature data in the related art (comparative example) and an embodiment.

According to an embodiment, as shown in Table 2, it can be seen that a light output, voltage characteristic, and the like are significantly improved.

TABLE 2

|  |  |  | Comparative Example | Embodiment | Remarks |
|---|---|---|---|---|---|
| Number of Emitters (ea) |  |  | 202 | 202 |  |
| Chip | $W_p$ | nm | 937.5 | 939 |  |
| Characteristic (@2.5 A) | $P_{op}$ | mW | 1516 | 1858 | 22.6% increase |
|  | $V_f$ | V | 2.19 | 1.96 | 0.23 V decrease |
|  | PCE | % | 27.8 | 38.0 | 36.7% increase |

Next, referring to FIG. 3, in the surface-emitting laser device according to an embodiment, a light energy distribution depending on a position is shown. As described above, the light energy distribution becomes lower as it becomes relatively farther from the active region 230. In an embodiment, concentration of the first conductive dopant in the first group first reflective layer 221 may be controlled to be higher than that of the dopant in the second group first reflective layer 222.

For example, referring to FIG. 2, in an embodiment, the first reflective layer 220 may include a first group of first reflective layer 221 disposed on one side of the active region 230 and a second group first reflective layer 222 disposed closer to the active region 230 than the first group first reflective layer 221.

At this point, the light energy in the second group first reflective layer 222 disposed adjacent to the active region 230 becomes higher than that in the first group first reflective layer 221.

An embodiment controls concentration of the first conductive dopant in the second group first reflective layer 222, considering a light energy distribution, to be lower than that of the dopant in the first group first reflective layer 221, the first conductive dopant is relatively highly doped in the first group first reflective layer 221 region, in which the light energy is relatively low, so that in the second group first reflective layer 222, the light absorption by the dopant is minimized and also, a light output is improved, and in the first group first reflective layer 221, voltage efficiency is improved by the resistance improvement by the relatively high dopant, and thus there is a specific technical effect that it is possible to provide a surface-emitting laser device and a light-emitting device including the same, capable of simultaneously improving a light output and voltage efficiency.

For example, the concentration of the dopant in the first group first reflective layer 221 may be about 2.00E18, and the concentration of the dopant in the second group first reflective layer 222 may be about 1.00E18, but is not limited thereto. Also, in an embodiment, the second reflective layer 250 may include a first group second reflective layer 251 disposed adjacent to the active region 230 and a second group second reflective layer 252 disposed to be spaced apart from the active region 230 rather than the first group second reflective layer 251.

At this point, the light energy in the first group second reflective layer 251 disposed adjacent to the active region 230 becomes higher than that in the second group second reflective layer 252.

In this manner, an embodiment controls concentration of the second conductive dopant in the first group second reflective layer 251, considering a light energy distribution, to be lower than that of the dopant in the second group second reflective layer 252, the second conductive dopant is relatively highly doped in the second group second reflective layer 252 region, in which the light energy is relatively low, so that in the first group second reflective layer 251, the light absorption by the dopant is minimized and also, a light output is improved, and in the second group second reflective layer 252, voltage efficiency is improved by the resistance improvement by the dopant, and thus there is a specific technical effect that it is possible to provide a surface-emitting laser device and a light-emitting device including the same, capable of simultaneously improving a light output and voltage efficiency.

<Active Region>

Referring again to FIG. 2, an embodiment may include an active region 230 on the first reflective layer 220.

The active region 230 may include an active layer 232, a first cavity 231 disposed under the active layer 232, and a second cavity 233 disposed thereon. The active region 230 of an embodiment may include both the first cavity 231 and the second cavity 233, or may include only one of the two.

The active region 230 may be disposed between the first reflective layer 220 and the second reflective layer 250. The active region 230 of an embodiment may include an active layer 232 of any one of a single well structure, a multiple well structure, a single quantum well structure, a multi quantum well (MQW) structure, a quantum dot structure, and a quantum-wire structure.

The active layer 232 may be formed of a quantum well layer 232a and a barrier layer 232b using a compound semiconductor material of a Group III-V element, for example, one to three pair structure such as InGaAs/AlxGaAs, AlGaInP/GaInP, AlGaAs/AlGaAs, AlGaAs/GaAs, and GaAs/InGaAs, but is not limited thereto. The quantum well layer 232a may be formed of a material having an energy band gap smaller than that of the quantum barrier layer 232b. The active layer 232 may not be doped with a dopant.

The first cavity 231 and the second cavity 233 may be formed of $Al_yGa_{(1-y)}As$ (0<y<1), but are not limited thereto. For example, the first cavity 231 and the second cavity 233 may include a plurality of layers of $Al_yGa_{(1-y)}As$, respectively.

In an embodiment, an insulation region 242 is disposed on the active region 230 and an aperture 241 defined by the insulation region 242 is present.

The insulation region 242 may be formed of an insulation layer such as aluminum oxide and may function as a current insulation region, and the aperture 241, which is a non-insulation layer, may be disposed in a central region. The aperture 241 and the insulation region 242 may be referred to as an aperture region 240.

Specifically, the aperture region 240 may include aluminum gallium arsenide. At this point, the insulation region 242 may be formed as the AlGaAs in the aperture region 240 reacts with $H_2O$ and the edge thereof changes into aluminum oxide ($Al_2O_3$), and the central region not reacting with $H_2O$ may be an aperture 241 made of AlGaAs.

The insulation region 242 may include a plurality of layers, for example, a first insulation layer 242a and a second insulation layer 242b. A thickness of the first insulation layer 242a may be formed the same or differently.

According to an embodiment, light emitted from the active region 230 may be emitted to an upper region through the aperture 241 and light transmittance of the aperture 241 may be higher than that of the insulation region 242.

<Second Reflective Layer>

The second reflective layer 250 may be disposed on the aperture region 240 including the insulation region 242.

The second reflective layer 250 may include a gallium-based compound such as AlGaAs, and the second reflective layer 250 may be doped with a second conductive dopant. For example, the second conductive dopant may be a p-type dopant such as Mg, Zn, Ca, Sr, and Ba. Meanwhile, the first reflective layer 220 may be doped with the p-type dopant, and the second reflective layer 250 may be doped with an n-type dopant.

The second reflective layer 250 may be a distributed Bragg reflector (DBR). For example, the second reflective layer 250 may be a structure in which a plurality of layers made of materials having different refractive indexes are alternately stacked at least once.

Each layer of the second reflective layer 250 may include AlGaAs and in detail, may be made of a semiconductor material having a composition formula of $Al_xGa_{(1-x)}As$ (0<x<1). Here, when Al increases, the refractive index of each layer may decrease, and when Ga increases, the refractive index of each layer may increase. Further, a thickness of each layer of the second reflective layer 250 may be λ/4n, λ may be a wavelength of light emitted from the active layer, and n may be the refractive index of each layer with respect to the light of the above-described wavelength.

The second reflective layer 250 having such a structure may have a reflectivity of 99.9% with respect to light having a wavelength region of 940 nm.

The second reflective layer 250 may be formed by alternately stacking the layers and the number of pairs of layers in the first reflective layer 220 may be greater than that of pairs of layers in the second reflective layer 250. At this point, as described above, the reflectance of the first reflective layer 220 is about 99.999%, which may be greater than that of the second reflective layer 250, 99.9%.

In an embodiment, the second reflective layer 250 may include a first group second reflective layer 251 disposed adjacent to the active region 230 and a second group second reflective layer 252 disposed to be spaced apart from the active region 230 rather than the first group second reflective layer 251.

As described above, concentration of the first conductive dopant in the first group second reflective layer 251 may be lower than that of the dopant in the second group second reflective layer 252.

For example, the first group second reflective layer 251 may include about one to five pairs of a first group second-first layer 251a and a first group second-second layer 251b. The first group second-first layer 251a may be formed thicker than the first group second-second layer 251b. For example, the first group second-first layer 251a may be formed at a thickness of about 40 to 60 nm, and the first group second-second layer 251b may be formed at a thickness of about 20 to 30 nm.

Also, the second group second reflective layer 252 may include about 5 to 15 pairs of a second group second-first layer 252a and a second group second-second layer 252b. The second group second-first layer 252a may be formed thicker than the second group second-second layer 252b. For example, the second group second-first layer 252a may be formed at a thickness of about 40 to 60 nm, and the second group second-second layer 252b may be formed at a thickness of about 20 to 30 nm.

<Second Contact Electrode, Passivation Layer, Second Electrode>

Referring to FIG. 1, the surface-emitting laser device 200 according to an embodiment may be mesa etched from the second reflective layer 250 to the insulation region 242 and the active region 230 in a region around the aperture 241. Also, the mesa etching may be performed up to a part of the first reflective layer 220.

A second contact electrode 255 may be disposed on the second reflective layer 250, so that the region in which the second reflective layer 250 is exposed in a region between the second contact electrodes 255 may correspond to the aperture 241 in the central region of the above-described insulation region 242. Here, a width of the aperture 241 may be wider or narrower than that between the second contact electrodes 255. When the width of the aperture 241 is narrower than that between the second contact electrodes 255, light emitted from the active region 230 may be diffused and transmitted, and when the width of the aperture 241 is wider than that between the second contact electrodes 255, the light emitted from the active region 230 may be converged and transmitted. The second contact electrode 255 may improve a contact characteristic between the second reflective layer 250 and a second electrode 280 described later.

In FIG. 1, a passivation layer 270 may be disposed on a side surface and an upper portion surface of the mesa etched light-emitting structure, and on an upper portion surface of the first reflective layer 220. The passivation layer 270 may also be disposed on a side surface of the surface-emitting laser device 200 separated into units of devices to protect and isolate the surface-emitting laser device 200. The passivation layer 270 may be made of an insulation material, for example, a nitride or an oxide.

The passivation layer 270 may be thinner than the second contact electrode 255 on the upper portion surface of the light-emitting structure so that the second contact electrode 255 may be exposed to an upper portion of the passivation layer 270. The second electrode 280 may be disposed in electrical contact with the exposed second contact electrode 255, and the second electrode 280 may be extended to the upper portion of the passivation layer 270 to receive a current from the outside.

The second electrode 280 may be made of a conductive material, for example, a metal. For example, the second electrode 280 may be formed of a single layer or a multilayer structure including at least one of aluminum (Al), titanium (Ti), chrome (Cr), nickel (Ni), copper (Cu), and gold (Au).

<Manufacturing Method>

Hereinafter, a method of manufacturing a surface-emitting laser device according to an embodiment will be described with reference to FIGS. 5 to 8.

Figure 5:
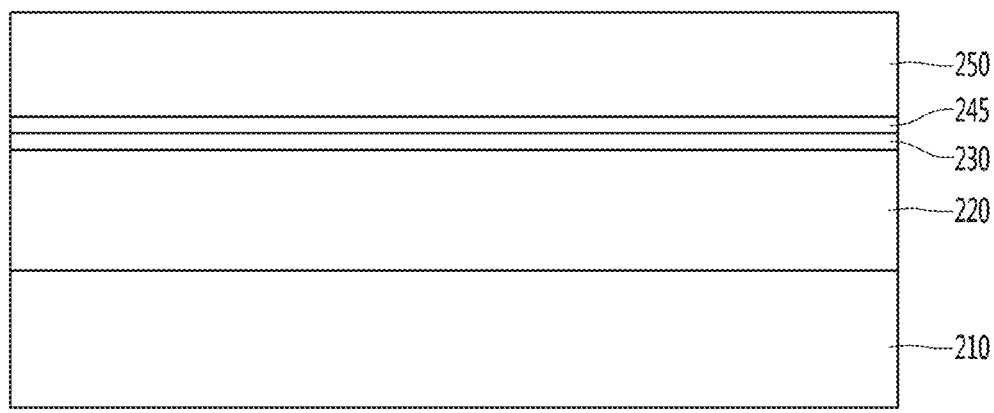
FIGS. 5 to 8 are cross-sectional views of a process of manufacturing the surface-emitting laser device according to the embodiment.

First, as shown in FIG. 5, a light-emitting structure including a first reflective layer 220, an active region 230, and a second reflective layer 250 is formed on a first substrate 210.

The first substrate 210 may be formed of a material suitable for growing a semiconductor material or a carrier wafer. The first substrate 210 may be formed of a material having excellent thermal conductivity, and may include a conductive substrate or an insulation substrate.

For example, in an embodiment, a GaAs substrate of the same kind as the first reflective layer 220 may be used as the first substrate 210. When the first substrate 210 is the same kind as the first reflective layer 220, lattice constants are matched to each other, so that a defect such as a lattice mismatch may not occur in the first reflective layer 220.

The first reflective layer 220 may be a structure in which layers formed of materials having different refractive indexes are alternately stacked at least one time.

Since the first reflective layer 220 may have a DBR structure as described above, AlGaAs may be supplied and grown. At this point, the first reflective layer 220 of the semiconductor material having a composition formula of $Al_xGa_{(1-x)}As$ (0<x<1) may be grown by varying supply amounts of Al and Ga.

For example, the first reflective layer 220 may be grown by using a method such as chemical vapor deposition (CVD) or molecular beam epitaxy (MBE) or sputtering or hydroxide vapor phase epitaxy (HYPE).

The first reflective layer 220 may be doped with a first conductivity type. For example, the first conductive dopant may include an n-type dopant such as Si, Ge, Sn, Se, and Te.

Also, the first reflective layer 220 may include a gallium-based compound, for example, AlGaAs, but is not limited thereto. The first reflective layer 220 may be a distributed Bragg reflector (DBR). For example, the first reflective layer 220 may be a structure in which layers formed of materials having different refractive indexes are alternately stacked at least once.

Next, the active region 230 may be formed on the first reflective layer 220.

The active region 230 may include an active layer 232, a first cavity 231 disposed under the active layer 232, and a second cavity 233 disposed thereon. The active region 230 of an embodiment may include both the first cavity 231 and the second cavity 233, or may include only one of the two.

For example, the active layer 232 may include any one of a single well structure, a multi well structure, a single quantum well structure, a multi quantum well (MQW) structure, a quantum dot structure, and a quantum-wire structure.

Then, a pre-aperture region 245 may be formed on the active region 230.

The pre-aperture region 245 may be made of a conductive material and may be made of the same material as the first and second reflective layers 220 and 250, but is not limited thereto.

When the pre-aperture region 245 includes AlGaAs, the pre-aperture region 245 may be formed of a semiconductor material having a composition formula of $Al_xGa_{(1-x)}As$ (0<x<1), for example, may have a composition formula of $Al_{0.98}Ga_{0.02}As$.

Then, a second reflective layer 250 may be formed on the pre-aperture region 245.

The second reflective layer 250 may be doped with a second conductivity type. The second reflective layer 250 may include a gallium-based compound, for example, AlGaAs, but is not limited thereto.

The second reflective layer 250 may be a distributed Bragg reflector (DBR). For example, the second reflective layer 250 may be a structure in which layers formed of materials having different refractive indexes are alternately stacked at least once. For example, the second reflective layer 250 may include AlGaAs and in detail, may be made of a semiconductor material having a composition formula of $Al_xGa_{(1-x)}As$ (0<x<1).

Further, a thickness of each layer of the second reflective layer 250 may be λ/4n, λ may be a wavelength of light emitted from the active region 230, and n may be the refractive index of each layer with respect to the light of the above-described wavelength. Here, λ may be from 650 to 980 nanometers (nm), and n may be the refractive index of each layer. The second reflective layer 250 having such a structure may have a reflectivity of 99.999% with respect to light having a wavelength region of 940 nm.

The second reflective layer 250 may include a gallium-based compound such as AlGaAs, and the second reflective layer 250 may be doped with a second conductive dopant. For example, the second conductive dopant may be a p-type dopant such as Mg, Zn, Ca, Sr, Ba, and C. Meanwhile, the first reflective layer 220 may be doped with the p-type dopant, and the second reflective layer 250 may be doped with the n-type dopant.

The second reflective layer 250 having such a structure may have a reflectivity of 99.9% with respect to light having a wavelength region of 940 nm.

Figure 6:
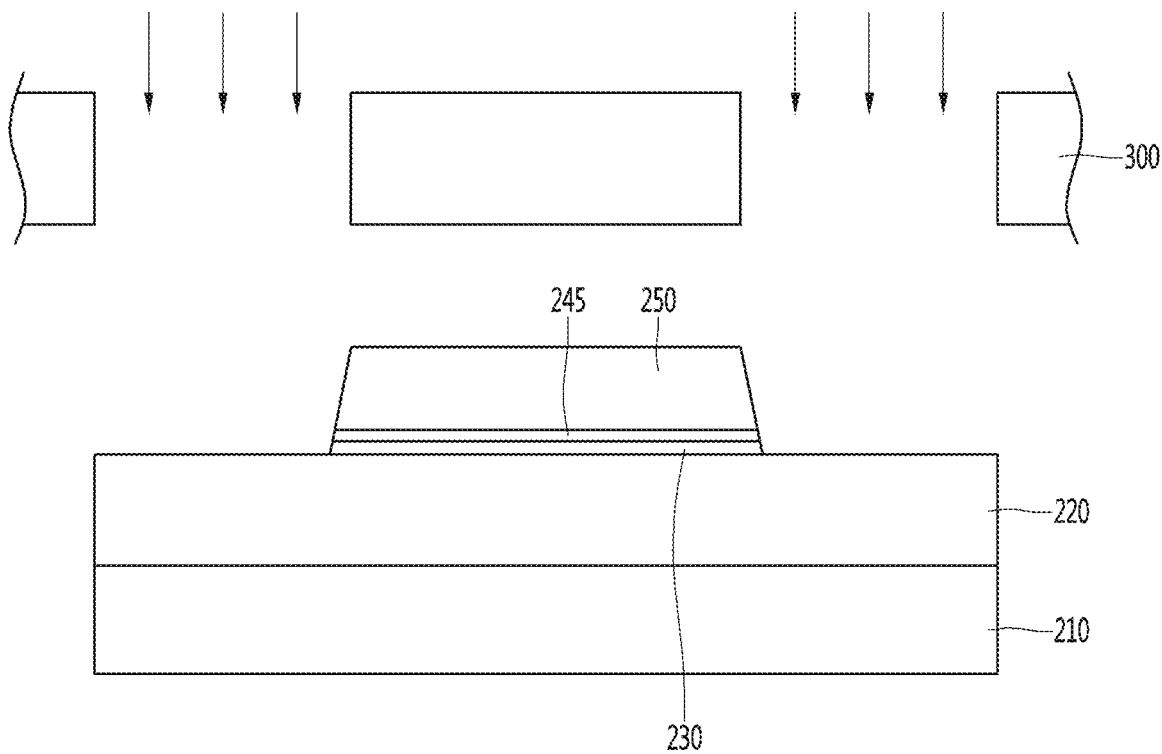

Then, as shown in FIG. 6, the light-emitting structure may be mesa etched by using a predetermined mask 300. At this point, the mesa etching may be performed from the second reflective layer 250 to the pre-aperture region 245 and the active region 230, and the mesa etching may be performed up to a part of the first reflective layer 220. In the mesa etching, the pre-aperture region 245 and the active region 230 may be removed from the second reflective layer 250 in the peripheral region by an inductively coupled plasma (ICP) etching method. In the mesa etching region, a side surface may be etched with a slope.

Figure 7:
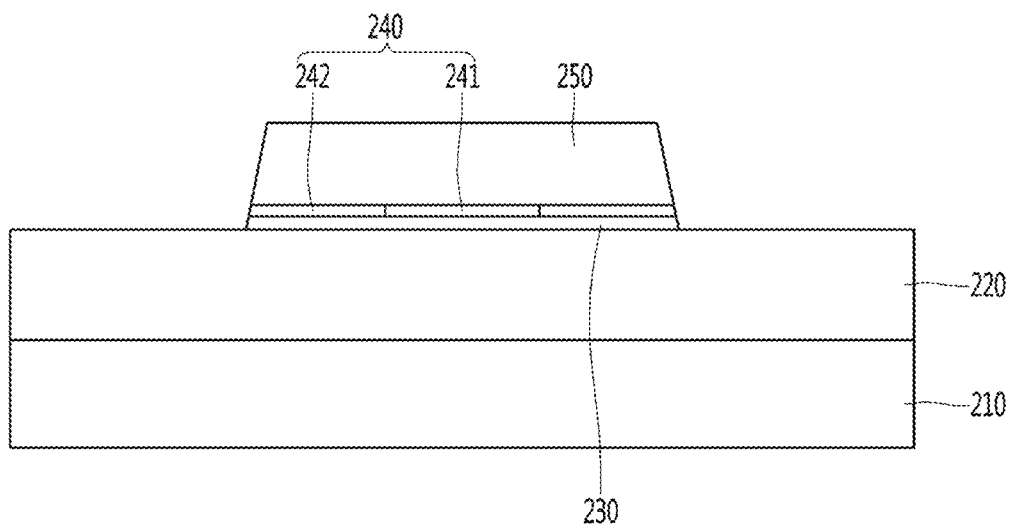

Then, as shown in FIG. 7, an edge region of the pre-aperture region may be changed to an insulation region 242, and for example, may be changed by wet oxidation.

For example, when oxygen is supplied from the edge region of the pre-aperture region 245, AlGaAs in the pre-aperture region may react with $H_2O$ to form aluminum oxide ($Al_2O_3$). At this point, by controlling a reaction time and the like, a central region of the pre-aperture region may not react with oxygen, and only the edge region may react with oxygen, so that aluminum oxide may be formed. Also, the edge region of the pre-aperture region may be changed to the insulation region 242 through ion implantation, but is not limited thereto. At the time of ion implantation, a photon may be supplied at an energy level of 300 keV or more.

After the above-described reaction step, the conductive AlGaAs may be disposed in the central region of the aperture region 240 and the non-conductive $Al_2O_3$ may be disposed in the edge region. Since AlGaAs in the central region is a portion in which light emitted from the active region 230 proceeds to an upper region, it can be referred to as an aperture 241 as described above.

Figure 8:
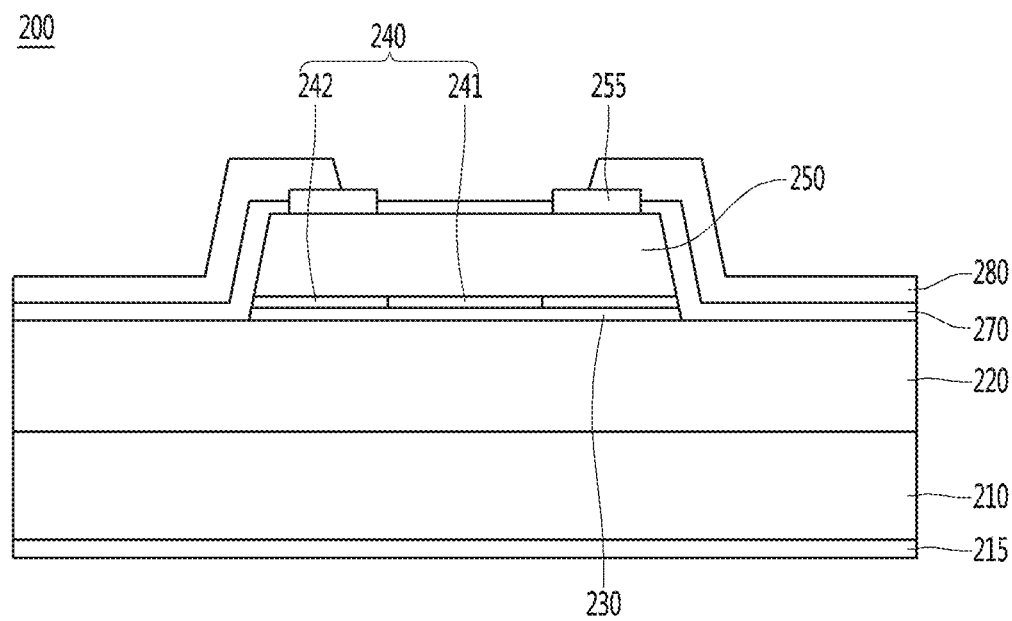

Then, as shown in FIG. 8, a second contact electrode 255 may be disposed on the second reflective layer 250, so that the region in which the second reflective layer 250 is exposed in the region between the second contact electrodes 255 may correspond to the aperture 241 which is the central region of the above-described aperture region 240. The second contact electrode 255 may improve a contact characteristic between the second reflective layer 250 and a second electrode 280 described later.

Then, the passivation layer 270 disposed on the second contact electrode 255 may be thinner than the second contact electrode 255 on the upper portion surface of the light-emitting structure, and at this point, the second contact electrode 255 may be exposed above the passivation layer 270.

The passivation layer 270 may include at least one of polyimide, silica ($SiO_2$), and silicon nitride ($Si_3N_4$).

Then, the second electrode 280 may be disposed in electrical contact with the exposed second contact electrode 255 and the second electrode 280 may be extended above the passivation layer 270 to receive a current.

The second electrode 280 may be made of a conductive material, for example, a metal. For example, the second electrode 280 may be formed of a single layer or a multilayer structure including at least one of aluminum (Al), titanium (Ti), chrome (Cr), nickel (Ni), copper (Cu), and gold (Au).

A first electrode 215 may be disposed under the first substrate 210. A part of the bottom surface of the first substrate 210 may be removed through a predetermined grinding process or the like before disposing the first electrode 215, thereby improving heat radiation efficiency.

The first electrode 215 may be made of a conductive material, for example, a metal. For example, the first electrode 215 may be formed of a single layer or a multilayer structure including at least one of aluminum (Al), titanium (Ti), chrome (Cr), nickel (Ni), copper (Cu), and gold (Au).

The above-described surface-emitting laser device may be a laser diode, and the inside of the two reflective layers may function as a resonator. At this time, electrons and holes may be supplied to the active layer from the first reflective layer 220 of the first conductivity type and the second reflective layer 250 of the second conductivity type, so that the light emitted from the active region 230 may be reflected and amplified inside the resonator. When reached to a threshold current, the light may be emitted to the outside through the above-described aperture 241.

The light emitted from the surface-emitting laser device according to an embodiment may be light of a single wavelength and a single phase, and the single wavelength region may vary depending on the composition of the first reflective layer 220, the second reflective layer 250, and the active region 230.

Also, referring to FIGS. 9 to 14, a method of manufacturing a surface-emitting laser device according to a second embodiment will be described. In the following description, in order to improve heat radiation performance, a process of forming a light-emitting structure on a predetermined growth substrate 190 and then removing the growth substrate 190 has been described, but the manufacturing method is not limited thereto.

Figure 9:
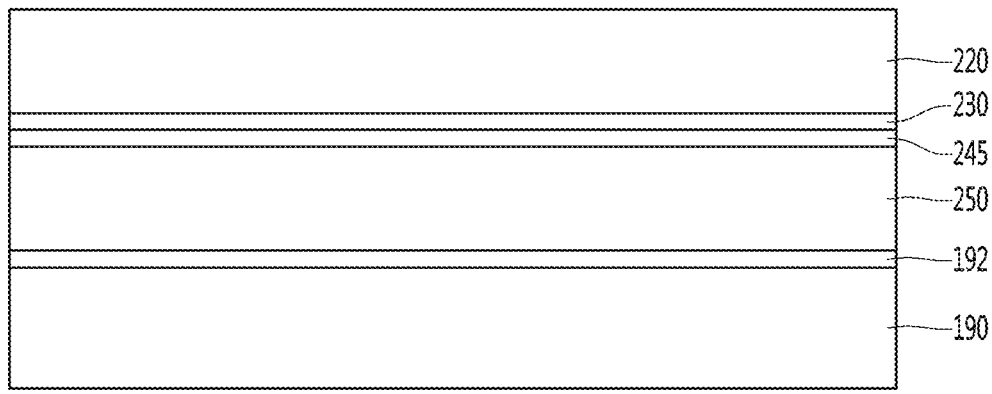
FIGS. 9 to 14 are cross-sectional views of a process of manufacturing a surface-emitting laser device according to a second embodiment.

First, as shown in FIG. 9, a light-emitting structure including a second reflective layer 250, an active region 230, and a first reflective layer 220 is formed on the growth substrate 190.

The growth substrate 190 may be formed of a material suitable for growing a semiconductor material or a carrier wafer. The growth substrate 190 may be formed of a material having excellent thermal conductivity, and may include a conductive substrate or an insulation substrate.

For example, in an embodiment, a GaAs substrate of the same kind as the second reflective layer 250 may be used as the growth substrate 190. When the growth substrate 190 is the same kind as the second reflective layer 250, lattice constants are matched, and a defect such as a lattice mismatch may not occur in the second reflective layer.

In addition, an etch stop layer 192 may be formed on the growth substrate 190.

Then, the second reflective layer 250 may be formed on the growth substrate 190 or the etch stop layer 192.

The second reflective layer 250 may have a structure in which a third layer (not shown) and a fourth layer (not shown) made of materials having different refractive indexes are alternately stacked at least once.

Since the second reflective layer 250 may have a DBR structure as described above, AlGaAs as a material of the third and fourth layers may be supplied and grown. At this point, the second reflective layer 250 of the semiconductor material having a composition formula of $Al_xGa_{(1-x)}As$ (0<x<1) may be grown by varying supply amounts of Al and Ga.

For example, the third layer may include $Al_{0.88}Ga_{0.12}As$, the fourth layer may be grown as $Al_{0.16}Ga_{0.84}As$, and may be grown by a using method such as chemical vapor deposition (CVD), molecular beam epitaxy (MBE), sputtering, hydroxide vapor phase epitaxy (HYPE), or the like.

Then, a pre-aperture region 245 may be formed on the second reflective layer 250. The pre-aperture region 245 may be made of a conductive material and may be made of the same material as the first and second reflective layers 220 and 250, but is not limited thereto.

When the pre-aperture region 245 includes AlGaAs, the pre-aperture region 245 may be formed of a semiconductor material having a composition formula of $Al_xGa_{(1-x)}As$ (0<x<1), for example, may have a composition formula of $Al_{0.98}Ga_{0.02}As$.

Then, the active region 230 and the first reflective layer 220 may be formed on the pre-aperture region 245. The active region 230 may include an active layer 232, a first cavity 231 disposed under the active layer 232, and a second cavity 233 disposed thereon. The active region 230 of an embodiment may include both the first cavity 231 and the second cavity 233, or may include only one of the two.

The active layer 232 may include any one of a single well structure, a multi well structure, a single quantum well structure, a multi quantum well (MQW) structure, a quantum dot structure, and a quantum-wire structure.

The active layer 232 may be formed of a quantum well layer and a quantum barrier layer using a compound semiconductor material of a Group III-V element, for example, a pair structure such as AlGaInP/GaInP, AlGaAs/AlGaAs, AlGaAs/GaAs, and GaAs/InGaAs, but is not limited thereto. The quantum well layer may be formed of a material having an energy band gap smaller than that of the quantum barrier layer.

The first reflective layer 220 may be doped with a first conductivity type. The first reflective layer 220 may include a gallium-based compound, for example, AlGaAs, but is not limited thereto.

The first reflective layer 220 may be a distributed Bragg reflector (DBR). For example, the first reflective layer 220 may have a structure in which a first layer (not shown) and a second layer (not shown) made of materials having different refractive indexes are alternately stacked at least once.

The first layer and the second layer may include AlGaAs, and in detail, may be made of a semiconductor material having a composition formula of $Al_xGa_{(1-x)}As$ (0<x<1).

Here, as Al in the first layer or the second layer increases, the refractive index of each layer may decrease, and when Ga increases, the refractive index of each layer may increase.

Further, a thickness of each of the first layer and the second layer may be $\lambda/4n$, $\lambda$ may be a wavelength of light generated in the active region 230, and n may be the refractive index of each layer with respect to light of the above-described wavelength. Here, $\lambda$ may be from 650 to 980 nanometers (nm), and n may be the refractive index of each layer. The first reflective layer 220 having such a structure may have a reflectance of 99.999% with respect to light in a wavelength region of 940 nm.

The thicknesses of the first and second layers may be determined depending on the respective refractive indexes and the wavelength $\lambda$ of the light emitted in the active region 230.

The first reflective layer 220 may be doped with a first conductive dopant. For example, the first conductive dopant may include an n-type dopant such as Si, Ge, Sn, Se, and Te.

Figure 10:
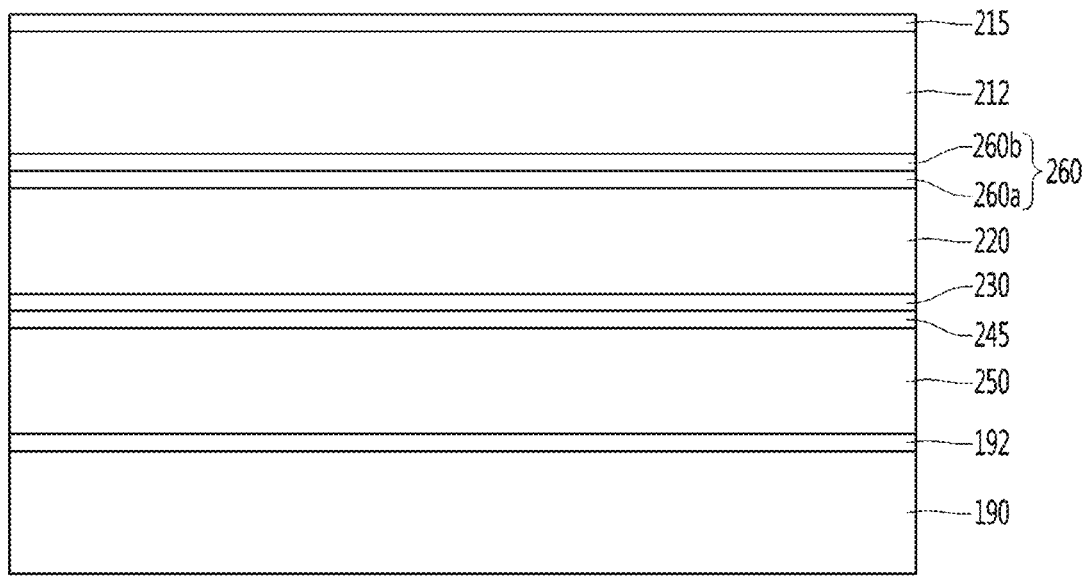

Then, as shown in FIG. 10, a second substrate 212 may be bonded onto the first reflective layer 220. An embodiment may bond the second substrate 212 on the first reflective layer 220 by interposing an adhesive layer 260.

The adhesive layer 260 may be formed of a single layer or a plurality of layers and may include a first adhesive layer 260a and a second adhesive layer 260b. For example, the second adhesive layer 260b may be disposed on a lower portion of the second substrate 212, the first adhesive layer 260a may be disposed on an upper portion of the first reflective layer 220, and the second adhesive layer 260b and the first adhesive layer 260a may be bonded to each other so that the second substrate 212 and the first reflective layer 220 may be bonded.

The adhesive layer 260 may include at least one of AuSn, NiSn, and InAu.

The second substrate 212 may be a conductive substrate or a non-conductive substrate. When the conductive substrate is used, a metal having excellent electrical conductivity may be used, and since heat generated at the time of operating the surface-emitting laser device 200 should be sufficiently dissipated, a metal having high thermal conductivity, or a silicon (Si) substrate may be used. When the non-conductive substrate is used, an aluminum nitride such as an AlN substrate may be used.

Then, a first electrode 215 may be disposed on the second substrate 212.

The first electrode 215 may be made of a conductive material, for example, a metal. For example, the first electrode 215 may be formed of a single layer or a multilayer structure including at least one of aluminum (Al), titanium (Ti), chrome (Cr), nickel (Ni), copper (Cu), and gold (Au).

Figure 11:
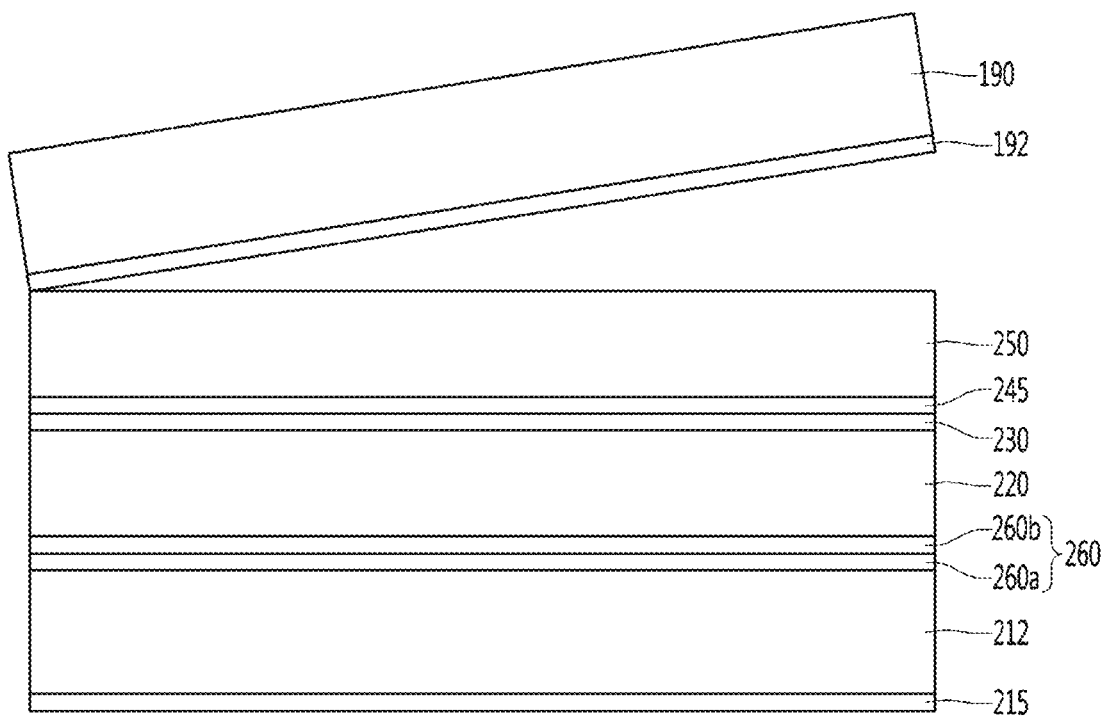

Then, as shown in FIG. 11, the growth substrate 190 may be separated. The removal of the growth substrate 190 may be performed by a laser lift off (LLO) method by using an excimer laser or the like in the case of a sapphire substrate, or may be performed by a dry and wet etching method.

As an example of the laser lift off method, when excimer laser light having a wavelength in a predetermined region is focused and irradiated in a direction of the growth substrate 190, thermal energy is concentrated on an interface between the growth substrate 190 and the second reflective layer 250 so that the interface between the growth substrate 190 and the second reflective layer 250 is separated into gallium and nitrogen molecules and separation of the growth substrate 190 may occur instantaneously at a portion in which the laser light passes.

Here, the etch stop layer 192 may protect the second reflective layer 250 when the growth substrate 190 is removed from the light-emitting structure.

Figure 12:
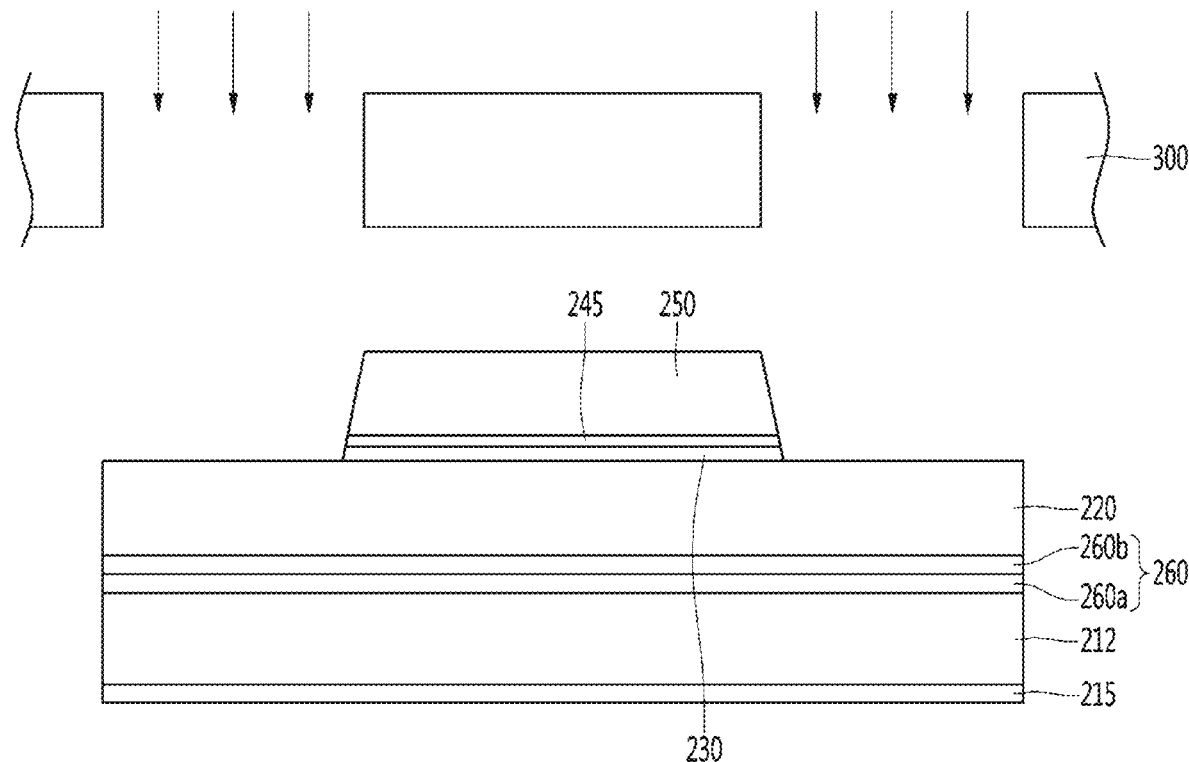

Then, as shown in FIG. 12, the light-emitting structure may be mesa etched by using a predetermined mask 300. At this point, the mesa etching may be performed from the second reflective layer 250 to the pre-aperture region 245 and the active region 230, and the mesa etching may be performed up to a part of the first reflective layer 220. In the mesa etching, the aperture region 240 and the active region 230 may be removed from the second reflective layer 250 in the peripheral region by an inductively coupled plasma (ICP) etching method. In the mesa etching region, a side surface may be etched with a slope.

Figure 13:
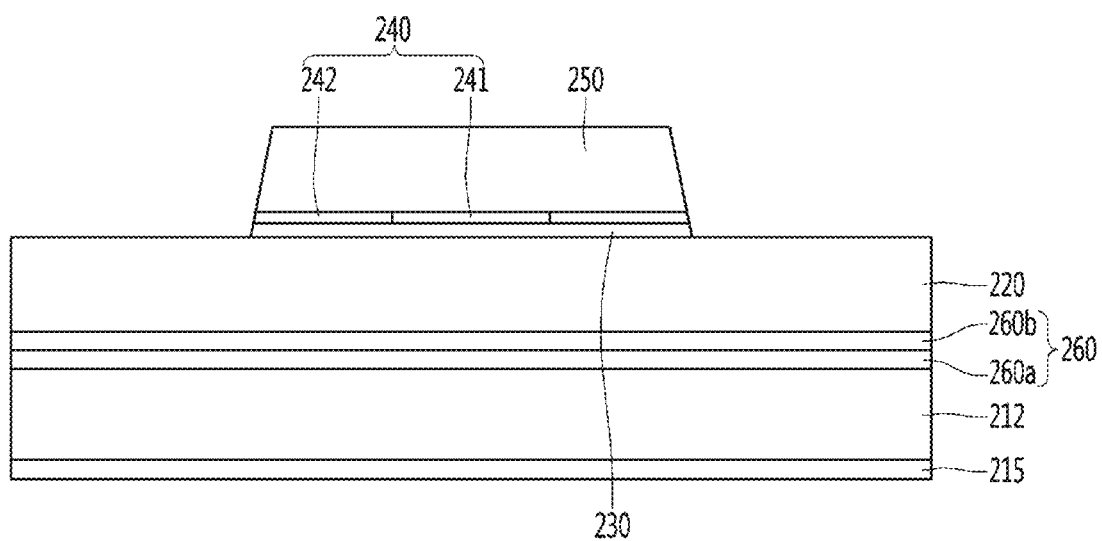

Then, as shown in FIG. 13, an edge region of the pre-aperture region may be changed to an insulation region 242, and for example, may be changed by wet oxidation.

For example, when oxygen is supplied from the edge region of the pre-aperture region, AlGaAs in the pre-aperture region may react with $H_2O$ to form aluminum oxide ($Al_2O_3$). At this point, by controlling reaction time and the like, a central region of the pre-aperture region may not react with oxygen, and only the edge region may react with oxygen, so that aluminum oxide may be formed. Also, the edge region of the pre-aperture region may be changed to the insulation region 242 through ion implantation, but is not limited thereto. At the time of ion implantation, a photon may be supplied at an energy level of 300 keV or more.

After the above-described reaction step, the conductive AlGaAs may be disposed in the central region of the aperture region 240 and the non-conductive $Al_2O_3$ may be disposed in the edge region. Since AlGaAs in the central region is a portion in which light emitted from the active region 230 proceeds to an upper region, it can be referred to as an aperture 241 as described above.

Figure 14:
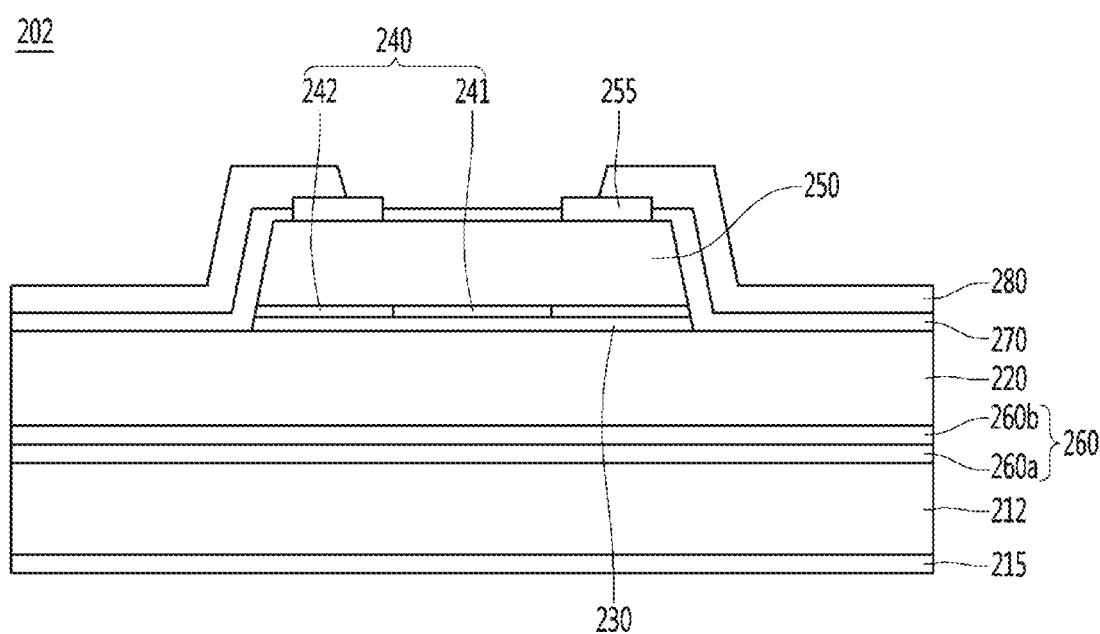

Then, as shown in FIG. 14, a second contact electrode 255 may be disposed on the second reflective layer 250, so that the region in which the second reflective layer 250 is exposed in the region between the second contact electrodes 255 may correspond to the aperture 241 which is the central region of the above-described aperture region 240. The second contact electrode 255 may improve a contact characteristic between the second reflective layer 250 and a second electrode 280 described later.

Then, the passivation layer 270 disposed on the second contact electrode 255 may be thinner than the second contact electrode 255 on the upper portion surface of the light-emitting structure, and at this point, the second contact electrode 255 may be exposed above the passivation layer.

The passivation layer 270 may include at least one of polyimide, silica ($SiO_2$), and silicon nitride ($Si_3N_4$).

Then, the second electrode 280 may be disposed in electrical contact with the exposed second contact electrode 255 and the second electrode 280 may be extended above the passivation layer 270 to receive a current.

The second electrode 280 may be made of a conductive material, for example, a metal. For example, the second electrode 280 may be formed of a single layer or a multilayer structure including at least one of aluminum (Al), titanium (Ti), chrome (Cr), nickel (Ni), copper (Cu), and gold (Au).

Then, third to fifth embodiments will be described.

Figure 15:
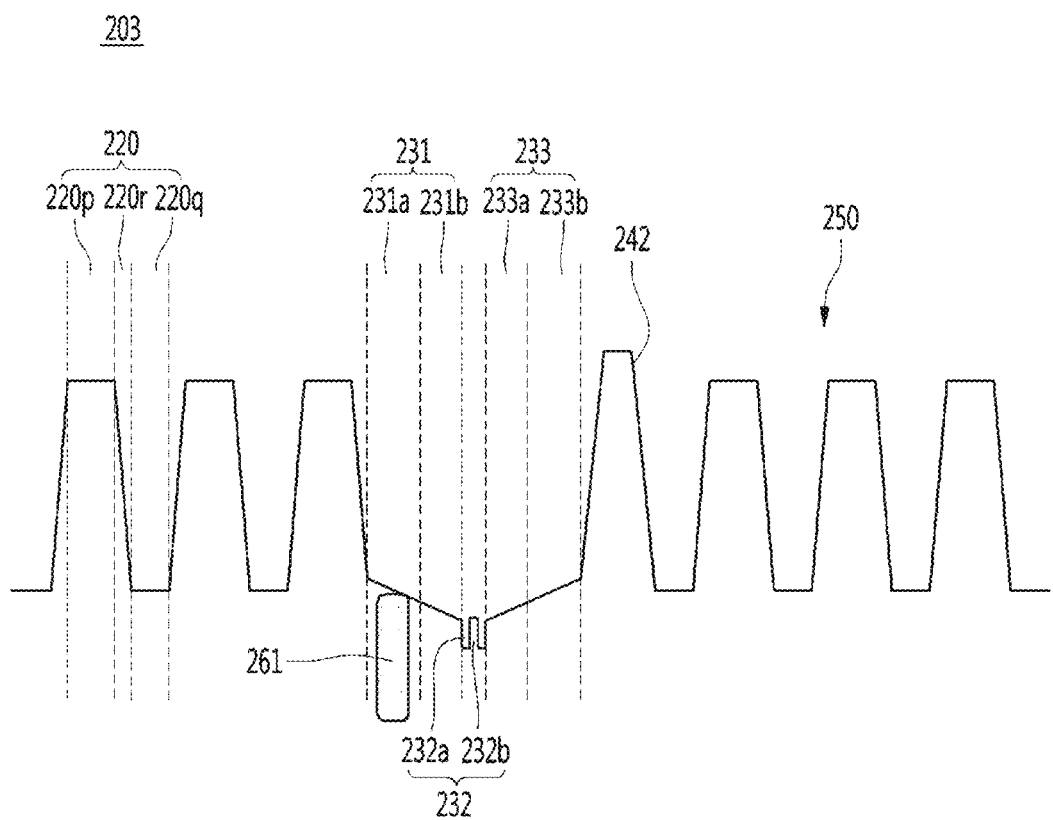
FIG. 15 is an exemplary view of an energy band diagram of a semiconductor device according to a third embodiment.
Figure 16:
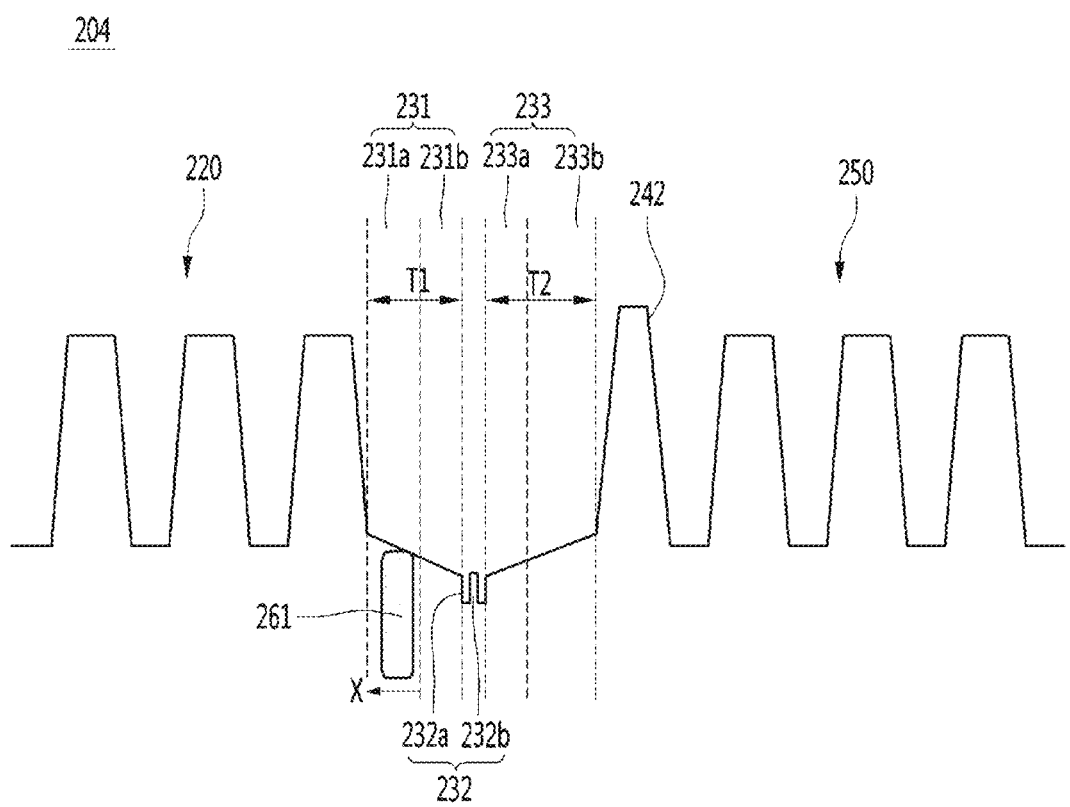
FIG. 16 is an exemplary view of an energy band diagram of a semiconductor device according to a fourth embodiment.
Figure 17A:
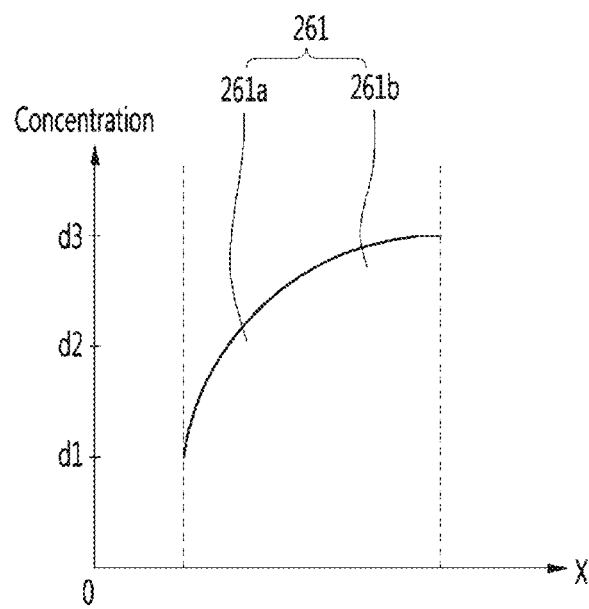
FIGS. 17A and 17B are doping concentration data in a cavity region of a semiconductor device according to an embodiment.
Figure 17B:
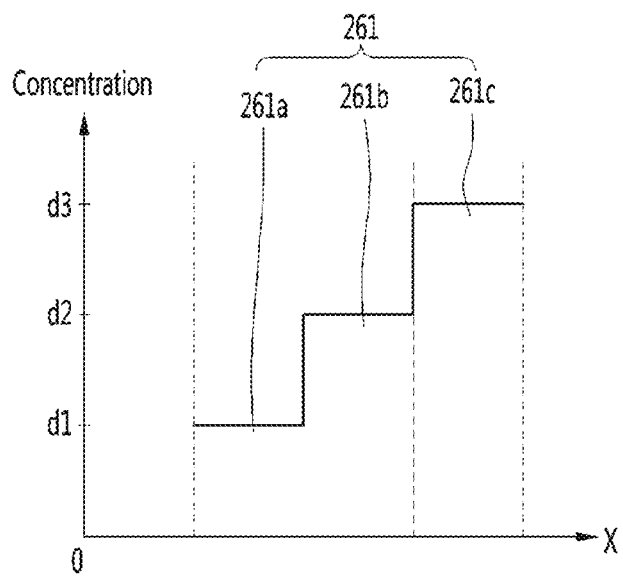
Figure 18:
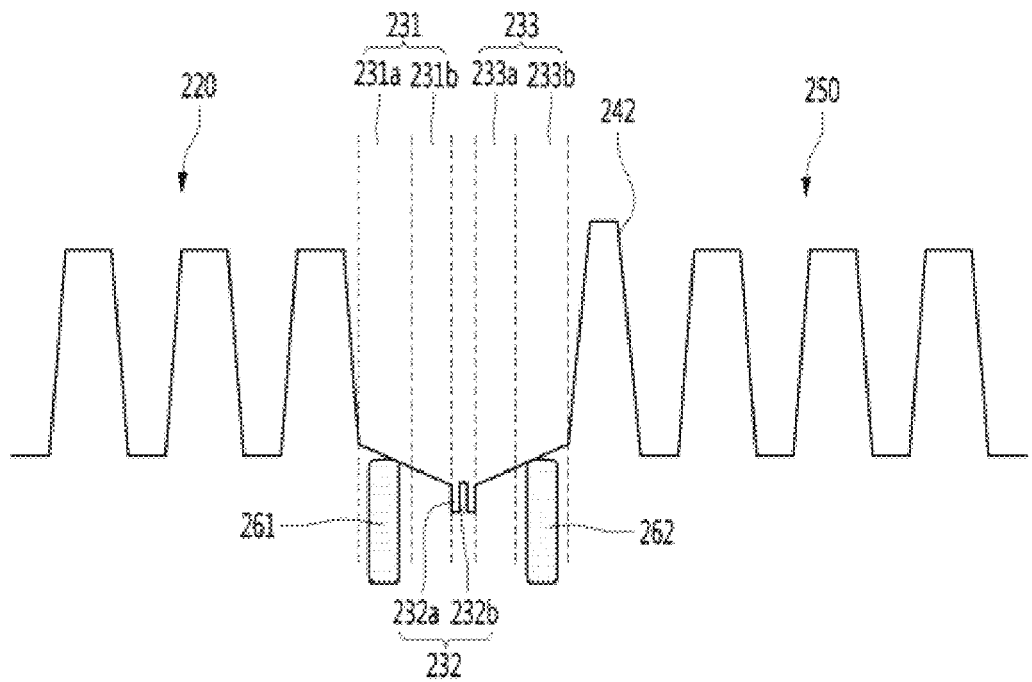
FIG. 18 is an exemplary view of an energy band diagram of a semiconductor device according to a fifth embodiment.

FIG. 15 is an exemplary view of an energy band diagram 203 in a surface-emitting laser device according to a third embodiment, FIG. 16 is an exemplary view of an energy band diagram 204 in a surface-emitting laser device according to a fourth embodiment, FIGS. 17A and 17B are doping concentration data in an active region of a surface-emitting laser device according to an embodiment. FIG. 18 is an exemplary view of an energy band diagram 205 in a surface-emitting laser device according to a fifth embodiment.

Third Embodiment

FIG. 15 is an exemplary view of an energy band diagram 203 in a surface-emitting laser device according to a third embodiment.

The third embodiment may adopt the technical features of the first embodiment and the second embodiment.

For example, referring to FIG. 15, in an embodiment, when the first reflective layer 220 includes $Al_xGa_{(1-x)}As$ (0<x<1), grading may be applied to the concentration of Al to minimize generation of an electric field between adjacent reflective layers.

For example, when the first reflective layer 220 includes a first layer 220p of a first aluminum concentration and a second layer 220q of a second aluminum concentration, a third layer 220r of a third aluminum concentration may be interposed between the first layer 220p of the first aluminum concentration and the second layer 220q of the second aluminum concentration, and the aluminum concentration of the third layer 220r may have a value between the aluminum concentration of the first layer 220p and that of the second layer 220q.

For example, the first reflective layer 220 may interpose the third layer 220r, which is $Al_{x3}Ga_{(1-x)}As$ (0.12≤X3≤0.88) between the first layer 220p of $Al_{0.12}Ga_{0.88}AS$ and the second layer 220q of $Al_{0.88}Ga_{0.12}As$. In this manner, according to an embodiment, by providing the third layer 220r having an intermediate aluminum concentration between the first layer 220p and the second layer 220q, generation of an electric field due to energy band bending may be minimized at an interface between adjacent reflective layers to lower a carrier barrier, and thus there is a technical effect that a light output can be improved.

Accordingly, according to an embodiment, it is possible to provide a surface-emitting laser device and a surface-emitting laser package including the same, capable of improving a light output by minimizing influence of the carrier barrier due to generation of an electric field in a reflective layer.

Hereinafter, the main technical features of the third embodiment will be mainly described.

Referring to FIG. 15, the third embodiment may include an active region 230 on the first reflective layer 220.

The active region 230 may include an active layer 232, a first cavity 231 disposed under the active layer 232, and a second cavity 233 disposed thereon. The active region 230 of an embodiment may include both the first cavity 231 and the second cavity 233, or may include only one of the two.

The first cavity 231 and the second cavity 233 may be formed of $Al_yGa_{(1-y)}As$ (0<y<1), but are not limited thereto. For example, the first cavity 231 and the second cavity 233 may include a plurality of layers of $Al_yGa_{(1-y)}As$, respectively.

For example, the first cavity 231 may include a first-first cavity layer 231a and a first-second cavity layer 231b. The first-first cavity layer 231a may be further spaced apart from the active layer 232 rather than the first-second cavity layer 231b. The first-first cavity layer 231a may be formed thicker than the first-second cavity layer 231b, but is not limited thereto.

One of the technical problems solved by embodiments of the subject invention is to provide a surface-emitting laser device capable of improving voltage efficiency and improving a light output and a surface-emitting laser package including the same.

In order to solve such a technical problem, an embodiment may provide a surface emitting laser device having a technical effect of improving voltage efficiency by reducing resistance in the active region and improving a light output, and a surface-emitting laser package including the same.

First, referring to FIG. 15, in the third embodiment, the active region 230 may include a first cavity 231 disposed on the first reflective layer 220, and an active layer 232 which includes a quantum well 232a and a quantum wall 232b and is disposed on the first cavity 231, and the first cavity 231 may be adjacent to the first reflective layer 220 and may include a first conductive-first doping layer 261.

According to the third embodiment, by including the first conductive-first doping layer 261 in a portion of the first cavity 231, and by reducing resistance compared to an existing active region, voltage efficiency may be improved by reducing the resistance in the active region, and thus there is a technical effect that a light output can be improved.

For example, in the third embodiment, when the first cavity 231 includes the first-first cavity layer 231a and the first-second cavity layer 231b, by including the first conductive-first doping layer 261 in the first-first cavity layer 231a and by reducing resistance compared to a conventional active region, there is a technical effect that voltage efficiency can be improved and a light output can be improved by reducing the resistance in the active region.

Table 3 below shows characteristic data of the surface-emitting laser devices of the comparative example and the embodiment. The comparative example is a case where doping does not proceed in the cavity.

TABLE 3

| Category | Comparative Example | Embodiment |
| --- | --- | --- |
| Number of emitters | 202 | 202 |
| Wp (nm) | 943.2 | 942.4 |
| Vf (V) | 2.19 | 2.07 |
| PCE (%) | 38.9 | 39.3 |

In the third embodiment, as the doping proceeds in the cavity, an operation voltage Vf is lowered compared with the comparative example through reduction of the resistance in the active region, and thus there is a technical effect that light efficiency or a light output can be improved.

In the third embodiment, the thickness of the first conductive-first doping layer 261 is controlled to be 10 to 70% of that of the first cavity 231, thereby improving voltage efficiency and a light output by reducing the resistance in the active region. At this point, when the region of the first conductive-first doping layer 261 exceeds 70% against that of the first cavity 231, a light output may be lowered due to absorption of light by the doping region, and when the region is less than 10%, the contribution of the resistance reduction effect may be low. Also, in an embodiment, the region of the first conductive-first doping layer 261 may be controlled to 20 to 50% of the region of the first cavity 231.

In an embodiment, the "region" may be compared based on a "width" occupied by each layer. Also, the "region" may be a "volume" occupied by each layer.

In an embodiment, concentration of a first conductive dopant in the first conductive-first doping layer 261 is controlled to be in the range of $1\times10^{17}$ to $8\times10^{17}$ (atoms/cm$^3$), and thus there is a technical effect of improving voltage efficiency and a light output by reducing the resistance in the active region. At this point, when the concentration of the first conductive dopant in the first conductive-first doping layer 261 exceeds an upper limit thereof, a light output may be lowered due to light absorption by the doping region, and when the concentration is less than an lower limit thereof, a contribution of a resistance reduction effect may be low.

At this point, in an embodiment, the concentration of the first conductive dopant of the first conductive-first doping layer 261 located in the first cavity 231 is controlled to be lower than that of a first conductive dopant of the first reflective layer 220 so that the light absorption by the doped region may be inhibited and voltage efficiency may be improved by reducing the resistance in the active region, thereby improving a light output.

For example, when the concentration of the first conductive dopant of the first conductive-first doping layer 261 is in the range of $1\times10^{18}$ to $2\times10^{18}$ (atoms/cm$^3$), the concentration of the first conductive dopant in the first conductive-first doping layer 261 is controlled in the range of $1\times10^{17}$ to $8\times10^{17}$ (atoms/cm$^3$), and thus there is a technical effect of improving voltage efficiency and a light output by reducing the resistance in the active region.

Also, one of the technical problems solved by embodiments of the subject invention is to provide a surface emitting laser device capable of improving a light output by improving optical confinement efficiency around the light emitting layer and a surface emitting laser package including the same.

In an embodiment, in order to solve such a technical problem, the embodiment has a technical effect of improving a light output through the improvement of optical confinement efficiency in the active region 230 around the light emitting layer.

Specifically, when the first cavity 231 includes an Al$_x$GaAs-based layer (0<X<1), the concentration of Al in the first cavity 231 may be controlled to decrease in a direction of the active layer 232, and as shown in FIG. 15, a band gap energy level of the first cavity 231 may be controlled to decrease in the direction of the active layer 232, and thus there is a technical effect that a light output can be improved by improving optical confinement efficiency.

Also, when the second cavity 233 includes an Al$_x$GaAs-based layer (0<X<1), the concentration of Al in the second cavity 233 may be controlled to decrease in the direction of the active layer 232, and as shown in FIG. 15, a band gap energy level of the second cavity 233 may be controlled to decrease in the direction of the active layer 232, and thus there is a technical effect that a light output can be improved by improving optical confinement efficiency.

Fourth Embodiment

Next, FIG. 16 is an exemplary view of an energy band diagram 204 in a surface-emitting laser device according to a fourth embodiment.

The fourth embodiment may employ the technical features of the above-described first to third embodiments, and the main features of the fourth embodiment will be mainly described below.

A second width T2 of the second cavity 233 may be greater than a first width T1 of the first cavity 231 in the fourth embodiment.

For example, the second cavity 233 may be formed of a material of Al$_y$Ga$_{(1-y)}$As (0<y<1), but is not limited thereto and may include a single layer or a plurality of layers of Al$_y$Ga$_{(1-y)}$As.

For example, the second cavity 233 may include a second-first cavity layer 233a and a second-second cavity layer 233b. The second-second cavity layer 233b may be further spaced apart from the active layer 232 than the second-first cavity layer 233a. The second-second cavity layer 233b may be formed thicker than the second-first cavity layer 233a, but is not limited thereto. At this point, the second-second cavity layer 233b may be formed to have a thickness of about 60 to 70 nm, and the second-first cavity layer 233a may be formed to have a thickness of about 40 to 55 nm, but is not limited thereto.

According to the fourth embodiment, the second width T2 of the second cavity 233 may be formed to be greater than the first width T1 of the first cavity 231, and resonance efficiency may be improved, thereby improving a light output.

Next, FIGS. 17A and 17B are doping concentration data in the first conductive-first doping layer 261 of the active region of the surface-emitting laser device according to the fourth embodiment shown in FIG. 16.

For example, in FIGS. 17A and 17B, the horizontal axis represents doping concentration of a first conductive dopant in the first conductive-first doping layer 261 when a distance from the active layer 232 in a direction of the first reflective layer 220 (direction X) increases.

According to an embodiment, concentration of the first conductive dopant in the first conductive-first doping layer 261 may be controlled to increase in the direction of the first reflective layer 220 from the direction of the active layer 232, so that the increase of the doping concentration in a region adjacent to the active layer 232 is controlled to inhibit a decrease in light intensity due to light absorption, and the doping concentration in a region adjacent to the first reflective layer 220 is increased to improve voltage efficiency due to a decrease in resistance, and thus there is a technical effect that a light output can be improved.

For example, referring to FIG. 17A, when the first conductive-first doping layer 261 includes a first-first doping layer 261a and a first-second doping layer 261b, as doping concentration increases from d1 to d2 to d3 in the first-second doping layer 261b disposed to be further spaced apart from the active layer 232 than the first-first doping layer 261a, a decrease in light intensity due to light absorption in the first-first doping layer 261a adjacent to the active layer 232 may be inhibited, and voltage efficiency according to a decrease in resistance in the region of the first-second doping layer 261b adjacent to the first reflective layer 220 may be improved, and thus there is a technical effect that a light output can be improved.

Also, referring to FIG. 17B, when the first conductive-first doping layer 261 includes the first-first doping layer 261a, the first-second doping layer 261b, and the first-third doping layer 261c, as the doping concentration in the first-second doping layer 261b and the first-third doping layer 261c further spaced apart from the active layer 232 than the first-first doping layer 261a sequentially increases to d1, d2, and d3, respectively, a decrease in light intensity due to light absorption in a region adjacent to the active layer 232 may be inhibited, and voltage efficiency according to the decrease in resistance in the region adjacent to the first reflective layer 220 may be improved, and thus there is a technical effect that a light output can be improved.

Fifth Embodiment

Next, FIG. 18 is an exemplary view of an energy band diagram 205 in a surface-emitting laser device according to a fifth embodiment.

According to the fifth embodiment, the active region 230 may include a second cavity 233 disposed between the second reflective layer 250 and the active layer 232, and the second cavity 233 may be adjacent to the second reflective layer 250 and may include a second conductive-second doping layer 262.

According to an embodiment, by including the second conductive-second doping layer 262 in a portion of the second cavity 233, and by reducing resistance compared to an existing active region, voltage efficiency may be improved by reducing the resistance in the active region, and thus there is a technical effect that a light output can be improved.

For example, in an embodiment, when the second cavity 233 includes a second-first cavity layer 233a and a second-second cavity layer 233b, the second conductive-second doping layer 262 may be included in the second-second cavity layer 233b further spaced apart from the active layer 232, and voltage efficiency may be improved by reducing the resistance in the active region compared to the related art, and thus there is a technical effect that a light output can be improved. For example, in an embodiment in which doping is performed on the second cavity 233, an operating voltage Vf is lowered compared with the comparative example through reduction of the resistance in the active region, and thus there is a technical effect of improving light efficiency or a light output.

In an embodiment, the region of the second conductive-second doping layer 262 is controlled to be 10 to 70% of that of the second cavity 233, and thus there is a technical effect of improving voltage efficiency and a light output by reducing the resistance in the active region. At this point, when the region of the second conductive-second doping layer 262 exceeds 70% against that of the second cavity 233, a light output may be lowered due to absorption of light by the doping region, and when the region is less than 10%, the contribution of the resistance reduction effect may be low.

Referring to the third to fifth embodiments, the total region of the first conductive-first doping layer 261 and the second conductive-second doping layer 262 may be controlled to 20 to 70% of the entire region of the active region 230. When an upper limit is exceeded, a light output may be lowered due to the absorption of light by the doped region, and when the total region is below a lower limit, the contribution of the resistance reduction effect may be low.

In an embodiment, concentration of a second conductive dopant in the second conductive-second doping layer 262 is controlled to be in the range of $1 \times 10^{17}$ to $8 \times 10^{17}$ (atoms/cm$^3$), and thus there is a technical effect of improving voltage efficiency and a light output by reducing the resistance in the active region. At this point, when the concentration of the second conductive dopant in the second conductive-second doping layer 262 exceeds an upper limit thereof, a light output may be lowered due to light absorption by the doping region, and when the concentration is less than an lower limit thereof, the contribution of the resistance reduction effect may be low.

Also, in an embodiment, the concentration of the second conductive dopant of the second conductive-second doping layer 262 may be controlled to be equal to or lower than that of a second conductive dopant of the second reflective layer 250 so that the light absorption by the doped region may be inhibited and voltage efficiency may be improved by reducing the resistance in the active region, thereby improving a light output.

For example, when the concentration of the second conductive dopant of the second conductive-second doping layer 262 is in the range of $7\times10^{17}$ to $3\times10^{18}$ (atoms/cm$^3$), the concentration of the second conductive dopant in the second conductive-second doping layer 262 is controlled in the range of $1\times10^{17}$ to $7\times10^{17}$ (atoms/cm$^3$), and thus there is a technical effect of improving voltage efficiency and a light output by reducing the resistance in the active region.

Figure 19:
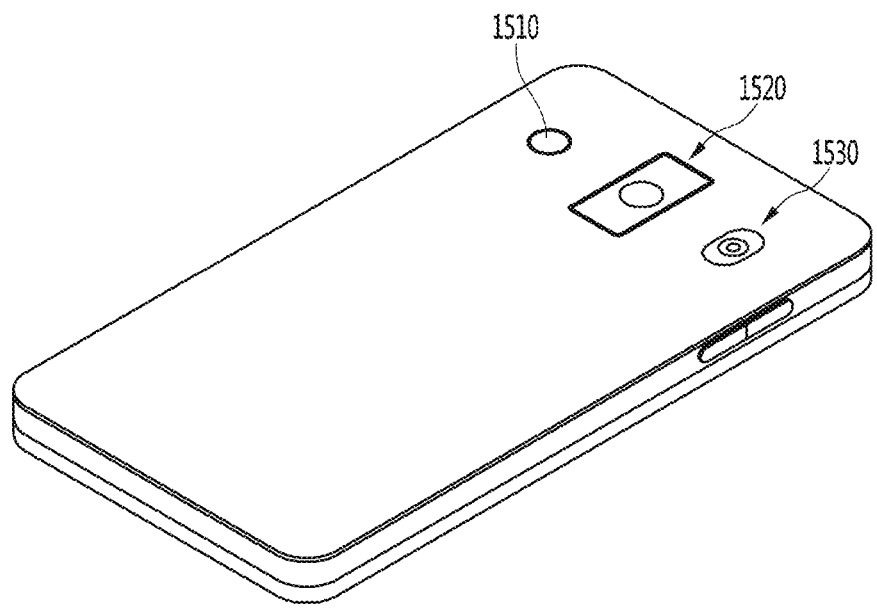
FIG. 19 is a perspective view of a mobile terminal including a surface-emitting laser package according to an embodiment.

Next, FIG. 19 is a perspective view of a mobile terminal to which a surface-emitting laser package according to an embodiment is applied.

As shown in FIG. 19, a mobile terminal 1500 of an embodiment may include a camera module 1520, a flash module 1530, and an autofocus device 1510 provided on a rear side. Here, the autofocus device 1510 may include one of the surface-emitting laser devices according to the above-described embodiments as a light-emitting unit.

The flash module 1530 may include a light-emitting element for emitting light therein. The flash module 1530 may be operated by a camera operation of the mobile terminal or a user's control.

The camera module 1520 may include an image photographing function and an autofocus function. For example, the camera module 1520 may include an autofocus function using an image.

The autofocus device 1510 may include an autofocus function using a laser. The autofocus device 1510 may be used under the condition that the auto focus function using the image of the camera module 1520 is deteriorated, for example, may be used mainly in a close-up of 10 m or less or dark environment. The autofocus device 1510 may include a light-emitting unit configured to include a surface-emitting laser device and a light-receiving unit configured to convert light energy into electrical energy such as a photodiode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A surface-emitting laser device comprising:
a first reflective layer and a second reflective layer; and
an active region disposed between the first reflective layer and the second reflective layer,
wherein the first reflective layer includes a first group first reflective layer and a second group first reflective layer,
wherein the second reflective layer includes a first group second reflective layer and a second group second reflective layer,
wherein the first group second reflective layer includes:
a first-first layer having a first aluminum concentration;
a first-second layer having a second aluminum concentration higher than the first aluminum concentration and disposed on the first-first layer; and
a first-third layer;
a first-fourth layer having a fourth aluminum concentration that varies from the second aluminum concentration to the first aluminum concentration and is disposed on the first-second layer,
wherein the first-second layer is disposed between the first-first layer and the first-fourth layer,
wherein the first-third layer is disposed between the first-second layer and the first-fourth layer, and
wherein the first-first layer is more near an aperture region than is the first-second layer,
wherein the second reflective layer is doped with a second conductive dopant,
wherein a doping concentration of the second conductive dopant of the first-fourth layer is higher than that of the first-first layer and/or the first-second layer,
wherein the active region comprises:
a first cavity region comprising a first conductive doping layer;
a second cavity region comprising a second conductive doping layer; and
an active layer between the first cavity region and the second cavity region,
wherein a thickness of the first conductive doping layer is 10% to 70% of a thickness of the first cavity region,
wherein the first cavity region includes a first-first cavity layer in contact with the first reflective layer and a first-second cavity layer in contact with the active layer,
wherein the first conductive doping layer is disposed only in the first-first cavity layer in contact with the first reflective layer,
wherein a doping concentration of the first conductive doping layer increases in a direction of the first reflective layer from of the active layer,
wherein the second cavity region includes a second-first cavity layer in contact with the active layer and a second-second cavity layer in contact with the second reflective layer,
wherein the second-first cavity layer is in direct contact with the second-second cavity layer, wherein the second conductive doping layer is disposed only in the second-second cavity layer, and
wherein the first cavity region includes an AlxGaAs-based layer (O<X<1), and a concentration of Al in the first cavity region is controlled to decrease in a direction of the active layer.

2. The surface-emitting laser device of claim 1, wherein the second conductive dopant comprises carbon (C).

3. The surface-emitting laser device of claim 2, wherein the second reflective layer includes a third group second reflective layer that is disposed more near the aperture region than is the first group second reflective layer,
wherein an average doping concentration of the second conductive dopant of the third group second reflective layers is less than that of the first group second reflective layer.

4. A light-emitting device comprising the surface-emitting laser device of claim 1.

5. The surface-emitting laser device of claim 1, wherein a thickness of the second conductive doping layer is 10% to 70% of a thickness of the second cavity region.

6. The surface-emitting laser device of claim 1, wherein a total region of the first conductive doping layer and the second conductive doping layer is in a range from 20% to 70% of an entire region of the active region.

7. A surface-emitting laser device comprising:
a first reflective layer and a second reflective layer; and
an active region disposed between the first reflective layer and the second reflective layer,
wherein the first reflective layer includes a first group first reflective layer and a second group first reflective layer,
wherein the second reflective layer includes a first group second reflective layer and a second group second reflective layer,
wherein the first group second reflective layer includes:
 a second-first reflective layer having a first aluminum concentration;
 a second-second reflective layer having a second aluminum concentration higher than the first aluminum concentration and disposed on one side of the second-first reflective layer; and
 a second-third reflective layer disposed between the second-first reflective layer and the second-second reflective layer, and having a third aluminum concentration that varies from the first aluminum concentration to the second aluminum concentration within the second-third reflective layer,
wherein a second conductive doping concentration of the second-third reflective layer is higher than a second conductive doping concentration of the second-first reflective layer or a conductive doping concentration of the second-second reflective layer,
wherein the active region comprises:
 a first cavity region comprising a first conductive doping layer;
 a second cavity region comprising a second conductive doping layer; and
 an active layer between the first cavity region and the second cavity region,
wherein a thickness of the first conductive doping layer is 10% to 70% of a thickness of the first cavity region,
wherein the first cavity region includes a first-first cavity layer in contact with the first reflective layer and a first-second cavity layer in contact with the active layer,
wherein the first conductive doping layer is disposed only in the first-first cavity layer in contact with the first reflective layer,
wherein a doping concentration of the first conductive doping layer increases in steps in a direction of the first reflective layer from the active layer,
wherein the second cavity region includes a second-first cavity layer in contact with the active layer and a second-second cavity layer in contact with the second reflective layer,
wherein the second-first cavity layer is in direct contact with the second-second cavity layer,
wherein the second conductive doping layer is disposed only in the second-second cavity layer,
wherein the first cavity region includes an AlxGaAs-based layer (0<X<1), and a concentration of Al in the first cavity region is controlled to decrease in a direction of the active layer, and
wherein a top surface of the first reflective layer directly contacts a bottom surface of the first cavity region.

8. The surface-emitting laser device of claim 7, wherein the first group second reflective layer includes a second-fourth reflective layer having a fourth aluminum concentration that varies from the first aluminum concentration to the second aluminum concentration within the second-fourth reflective layer, and
wherein a second conductive doping concentration of the second-fourth reflective layer is higher than the second conductive doping concentration of the second-third reflective layer.

9. The surface-emitting laser device of claim 7, wherein a thickness of the second-second reflective layer is thicker than that of the second-first reflective layer, and
wherein the thickness of the second-first reflective layer or the second-second reflective layer is thicker than that of the second-third reflective layer.

10. The surface-emitting laser device of claim 7, wherein a total region of the first conductive doping layer and the second conductive doping layer is in a range from 20% to 70% of an entire region of the active region.

11. A surface-emitting laser device comprising:
a first reflective layer and a second reflective layer; and
an active region disposed between the first reflective layer and the second reflective layer, wherein the first reflective layer includes a first group first reflective layer and a second group first reflective layer,
wherein the second reflective layer includes a first group second reflective layer and a second group second reflective layer, and
wherein the first group second reflective layer includes:
 a second-first reflective layer having a first refractive index;
 a second-second reflective layer having a second refractive index lower than the first refractive index and disposed on one side of the second-first reflective layer; and
 a second-third reflective layer having a third refractive index between the first refractive index and the second refractive index and disposed between the second-first reflective layer and the second-second reflective layer,
wherein a second conductive doping concentration of the second-third reflective layer is higher than a second conductive doping concentration of the second-first reflective layer or the second-second reflective layer,
wherein the active region comprises:
 a first cavity region comprising a first conductive doping layer;
 a second cavity region comprising a second conductive doping layer; and
 an active layer between the first cavity region and the second cavity region,
wherein a thickness of the first conductive doping layer is 10% to 70% of a thickness of the first cavity region,
wherein the first cavity region includes a first-first cavity layer in contact with the first reflective layer and a first-second cavity layer in contact with the active layer,
wherein the first conductive doping layer is disposed only in the first-first cavity layer in contact with the first reflective layer,
wherein a doping concentration of the first conductive doping layer increases in steps in a direction of the first reflective layer from the active layer,
wherein the second cavity region includes a second-first cavity layer in contact with the active layer and a second-second cavity layer in contact with the second reflective layer,
wherein the second-first cavity layer is in direct contact with the second-second cavity layer, wherein the second conductive doping layer is disposed only in the second-second cavity layer, wherein the first cavity region includes an Al$_x$GaAs-based layer (0<X<1), and a concentration of Al in the first cavity region is controlled to decrease in a direction of the active layer, and wherein a top surface of the first reflective layer directly contacts a bottom surface of the first cavity region.

12. The surface-emitting laser device of claim 11, wherein the second-first reflective layer has a first aluminum concentration, wherein the second-second reflective layer has a second aluminum concentration higher than the first aluminum concentration, and wherein the second-third reflective layer has a third aluminum concentration that varies from the first aluminum concentration to the second aluminum concentration.

13. The surface-emitting laser device of claim 12, wherein the first group second reflective layer includes a second-fourth reflective layer having a fourth aluminum concentration that varies from the first aluminum concentration to the second aluminum concentration in the second-fourth reflective layer.

14. The surface-emitting laser device of claim 13, wherein a second conductive doping concentration of the second-fourth reflective layer is higher than the second conductive doping concentration of the second-third reflective layer.

15. The surface-emitting laser device of claim 11, wherein a total region of the first conductive doping layer and the second conductive doping layer is in a range from 20% to 70% of an entire region of the active region.

16. A surface-emitting laser device comprising:
a first reflective layer including a first conductive dopant;
a second reflective layer including a second conductive dopant; and
an active region disposed between the first reflective layer and the second reflective layer,
wherein the active region includes a first cavity region disposed on the first reflective layer and an active layer disposed on the first cavity region, the active layer including a quantum well and a quantum barrier,
wherein the first cavity region is adjacent to the first reflective layer and includes a first conductive doping layer, wherein the active region includes a second cavity region comprising a second conductive doping layer, wherein a thickness of the first conductive doping layer is 10% to 70% of a thickness of the first cavity region, wherein the first cavity region includes a first-first cavity layer in contact with the first reflective layer and a first-second cavity layer in contact with the active layer, wherein the first conductive doping layer is disposed only in the first-first cavity layer in contact with the first reflective layer, wherein a doping concentration of the first conductive doping layer increases in steps in a direction of the first reflective layer from the active layer, wherein the second cavity region includes a second-first cavity layer in contact with the active layer and a second-second cavity layer in contact with the second reflective layer, wherein the second-first cavity layer is in direct contact with the second-second cavity layer, wherein the second conductive doping layer is disposed only in the second-second cavity layer, wherein the first cavity region includes an AlxGaAs-based layer (0<X<1), and a concentration of Al in the first cavity region is controlled to decrease in a direction of the active layer and wherein a top surface of the first reflective layer directly contacts a bottom surface of the first cavity region.

17. The surface-emitting laser device of claim 16, wherein the second cavity region is disposed between the second reflective layer and the active layer.

18. The surface-emitting laser device of claim 17, wherein a thickness of the second conductive doping layer is 70% or less of a thickness of the second cavity region.

19. The surface-emitting laser device of claim 18, wherein a total thickness of the first conductive doping layer and the second conductive doping layer is 20% to 70% of the entire thickness of the active region.

20. The surface-emitting laser device of claim 16, wherein a first conductive doping concentration of the first conductive doping layer is lower than a first conductive doping concentration of the first reflective layer.

* * * * *